US012488960B2

(12) United States Patent
Steele

(10) Patent No.: US 12,488,960 B2
(45) Date of Patent: Dec. 2, 2025

(54) PLASMA GENERATION APPARATUS, SYSTEM, AND METHOD

(71) Applicant: Matthew Steele, Lakewood, CO (US)

(72) Inventor: Matthew Steele, Lakewood, CO (US)

(73) Assignee: Lake Effect Consortium, LLC, Lehi, UT (US)

( * ) Notice: Subject to any disclaimer, the term of this patent is extended or adjusted under 35 U.S.C. 154(b) by 79 days.

(21) Appl. No.: 18/608,701

(22) Filed: Mar. 18, 2024

(65) Prior Publication Data

US 2024/0312762 A1 Sep. 19, 2024

Related U.S. Application Data

(60) Provisional application No. 63/491,056, filed on Mar. 18, 2023.

(51) Int. Cl.
*H01J 37/32* (2006.01)

(52) U.S. Cl.
CPC .. *H01J 37/32055* (2013.01); *H01J 37/32449* (2013.01); *H01J 37/3255* (2013.01); *H01J 37/32568* (2013.01)

(58) Field of Classification Search
CPC ........... H01J 37/32055; H01J 37/32449; H01J 37/3255; H01J 37/32568
See application file for complete search history.

(56) References Cited

U.S. PATENT DOCUMENTS

| | | |
|---|---|---|
| 5,539,274 A | 7/1996 | Araki et al. |
| 7,395,656 B2 | 7/2008 | Rooney |

(Continued)

FOREIGN PATENT DOCUMENTS

| | | | |
|---|---|---|---|
| CA | 2926308 A1 | 4/2015 | |
| CN | 118658768 A * | 9/2024 | ............ B24B 51/00 |

(Continued)

OTHER PUBLICATIONS

PCT/US2024/020459, "Notification of Transmittal of the International Search Report and the Written Opinion of the International Searching Authority, or the Declaration", International Searching Authority, Jun. 26, 2024, pp. 1-10.

(Continued)

*Primary Examiner* — Adam D Houston
(74) *Attorney, Agent, or Firm* — Kunzler Bean & Adamson; Alexis V. Nelson

(57) ABSTRACT

A plasma generation apparatus, system, and method for processing a material is presented. The apparatus includes a housing element, a plasma reaction chamber, multiple electrode rings, and a power supply. The housing element extends cylindrically along a longitudinal axis. The plasma reaction chamber is defined by an inner surface of the housing element and is configured to generate an ionized plasma field. Multiple electrode rings are disposed within the plasma reaction chamber. Each of the electrode rings includes multiple electrodes such that the electrode rings form an arc path within the plasma reaction chamber. A power supply is coupled to the outer surface of the housing element. The power supply includes a plurality of primary coils and a secondary coil wound about the primary coils. A coil core is in contact with at least a portion of each of the primary coils.

20 Claims, 22 Drawing Sheets

(56) References Cited

U.S. PATENT DOCUMENTS

| | | | | |
|---|---|---|---|---|
| 7,829,463 | B2 | 11/2010 | Matsumoto et al. | |
| 8,404,209 | B2 | 3/2013 | Moravsky et al. | |
| 9,284,642 | B2 | 3/2016 | Nakano et al. | |
| 9,556,932 | B2 | 1/2017 | Asano | |
| 9,738,524 | B2 | 8/2017 | Levendis et al. | |
| 11,101,113 | B2 * | 8/2021 | Collins | H01J 37/3233 |
| 11,230,394 | B2 | 1/2022 | Lozano et al. | |
| 11,577,111 | B2 | 2/2023 | Strathmann et al. | |
| 11,728,135 | B2 * | 8/2023 | Zhao | H01L 21/3065 118/723 R |
| 2006/0267503 | A1 | 11/2006 | Bystriskii et al. | |
| 2007/0071667 | A1 | 3/2007 | Tour et al. | |
| 2007/0176562 | A1 | 8/2007 | Takikawa et al. | |
| 2010/0074821 | A1 | 3/2010 | Grant | |
| 2011/0094683 | A1 * | 4/2011 | Chen | H05H 1/46 156/345.35 |
| 2013/0220975 | A1 * | 8/2013 | Dhindsa | H01J 37/321 216/68 |
| 2015/0059979 | A1 * | 3/2015 | Kim | H01J 37/32449 156/345.33 |
| 2016/0276134 | A1 * | 9/2016 | Collins | H01L 21/67213 |
| 2017/0301514 | A1 * | 10/2017 | Cho | H01J 37/32449 |
| 2018/0007773 | A1 | 1/2018 | Twarog et al. | |
| 2018/0080747 | A1 | 3/2018 | Nishikata et al. | |
| 2019/0246482 | A1 * | 8/2019 | Zimmerman | H01J 37/32568 |
| 2020/0071833 | A1 * | 3/2020 | Lau | C23C 16/45591 |
| 2021/0193439 | A1 * | 6/2021 | Uda | H01J 37/3211 |
| 2021/0327689 | A1 * | 10/2021 | Long | H01J 37/32119 |
| 2023/0245870 | A1 * | 8/2023 | Ikeda | C23C 16/45546 438/758 |
| 2023/0322589 | A1 | 10/2023 | Huang et al. | |
| 2023/0374662 | A1 * | 11/2023 | Jang | C23C 16/45565 |
| 2024/0107653 | A1 * | 3/2024 | Gribb | H05H 6/00 |
| 2024/0203707 | A1 * | 6/2024 | Nishio | H01L 21/3065 |
| 2024/0312762 | A1 * | 9/2024 | Steele | H01J 37/32568 |
| 2024/0412951 | A1 * | 12/2024 | Kim | H01J 37/32715 |
| 2025/0014877 | A1 * | 1/2025 | Nagai | H01J 37/32449 |
| 2025/0210304 | A1 * | 6/2025 | Moradian | H01J 37/32568 |
| 2025/0218743 | A1 * | 7/2025 | Kim | H01J 37/32449 |
| 2025/0218748 | A1 * | 7/2025 | Guo | H01J 37/32183 |

FOREIGN PATENT DOCUMENTS

| | | | | |
|---|---|---|---|---|
| CN | 119012485 | A * | 11/2024 | H05H 1/24 |
| EP | 3133635 | A1 * | 2/2017 | H01L 21/6833 |
| JP | 2014066712 | A | 4/2014 | |
| KR | 102660954 | B1 * | 4/2024 | H01L 21/3065 |
| WO | WO-2025144821 | A1 * | 7/2025 | H01J 37/32183 |

OTHER PUBLICATIONS

PCT/US2024/020451, "Notification of Transmittal of the International Search Report and the Written Opinion of the International Searching Authority, or the Declaration", International Searching Authority, Jul. 2, 2024, pp. 1-11.

* cited by examiner

PLASMA GENERATION APPARATUS, SYSTEM, AND METHOD

TECHNICAL FIELD

The present disclosure relates generally to materials processing systems. More particularly, the present disclosure relates to materials processing systems utilizing advanced molecular manipulation.

BACKGROUND

In modern manufacturing processes, particularly within industries such as semiconductor fabrication, $CO_2$ sequestering, water purification, and utilities, there is an increasing demand for advanced molecular manipulation techniques. These processes often require precise control over chemical reactions, material properties, and gas compositions to achieve desired outcomes efficiently and sustainably.

Traditional approaches to molecular manipulation often involve complex and fragmented setups, requiring multiple components and processes for molecular manipulation and fabrication. These conventional systems are not only cumbersome but also lack the flexibility needed to adapt to evolving manufacturing requirements and effective use in situ. Such systems also tend to be inefficient due to energy losses and inefficiencies in component integration.

Accordingly, there is a need for an innovative plasma generation apparatus and method for streamlining and enhancing molecular manipulation techniques across various manufacturing sectors. Also, what is needed is a plasma generation apparatus and method that offers integrated functionalities, enabling seamless coordination of multiple processing techniques within a single, versatile platform. Beneficially, such a plasma generation apparatus and method would provide flexibility to add or modify process steps in situ.

In the present disclosure, where a document, act or item of knowledge is referred to or discussed, this reference or discussion is not an admission that the document, act or item of knowledge or any combination thereof was at the priority date, publicly available, known to the public, part of common general knowledge or otherwise constitutes prior art under the applicable statutory provisions; or is known to be relevant to an attempt to solve any problem with which the present disclosure is concerned.

While certain aspects of conventional technologies have been discussed to facilitate the present disclosure, no technical aspects are disclaimed and it is contemplated that the claims may encompass one or more of the conventional technical aspects discussed herein.

BRIEF SUMMARY

According to one aspect of the present disclosure, a plasma generation apparatus for processing a material includes a housing element, a plasma reaction chamber, multiple electrode rings, and a power supply. The housing element includes an outer surface and an inner surface extending cylindrically along a longitudinal axis between a first end and a second end. The outer surface is disposed opposite the inner surface. The plasma reaction chamber is defined by the inner surface and configured to generate a plasma field for processing a material. Multiple electrode rings are disposed within the plasma reaction chamber. Each of the electrode rings includes multiple electrodes such that at least a portion of the electrodes corresponding to more than one of the electrode rings forms an arc path between the first end and the second end.

A power supply is coupled to the outer surface of the housing element. The power supply includes a plurality of primary coils winding about the outer surface in a direction perpendicular to the longitudinal axis. A secondary coil is wound about the plurality of primary coils in a direction perpendicular to the longitudinal axis, and a coil core is in contact with at least a portion of each of the plurality of primary coils.

In some embodiments, the first end and the second end include an exterior surface having a diameter greater than the outer surface. The power supply may thus be maintained between the first end and the second end.

In some embodiments, each of the primary coils includes an anode and a cathode. At least a portion of the anode and the cathode may extend between the outer surface and the inner surface.

In some embodiments, each of the electrode rings includes a modular ring profile geometry. In some embodiments, each of the electrode rings includes an outer surface having a diameter substantially corresponding to an inner diameter of the plasma reaction chamber.

In some embodiments, the plurality of electrode rings includes a first electrode ring having a first set of catalysts and a second electrode ring having a second set of catalysts. In some embodiments, the first electrode ring is configured to be disposed adjacent to the second electrode ring to facilitate a chemical reaction between the first set of catalysts and the second set of catalysts. In some embodiments, each of the electrode rings includes multiple piezoelectric crystals configured to harvest arc energy.

According to another aspect of the disclosure, a plasma generation system is presented for processing a material through a plasma field. The plasma generation system includes a plasma generation assembly including a housing element, a plasma reaction chamber, a plurality of electrode rings, and a power supply. The housing element includes an inner surface extending cylindrically along a longitudinal axis between a first end and a second end. An outer surface is disposed opposite the inner surface between the first end and the second end.

The plasma reaction chamber is defined by the inner surface and is configured to generate a plasma field for processing a material. The plurality of electrode rings is disposed within the plasma reaction chamber. Each of the electrode rings includes multiple electrodes. At least a portion of the electrodes corresponding to more than one of the electrode rings forms an arc path between the first end and the second end.

The power supply is coupled to the outer surface. The power supply includes multiple primary coils winding about the outer surface in a direction perpendicular to the longitudinal axis. A secondary coil winds about the primary coils in a direction perpendicular to the longitudinal axis and is configured to induce a voltage on the plurality of primary coils. A coil core is in contact with at least a portion of each of the primary coils.

Multiple modular processing components are coupled to the plasma generation apparatus to form a hollow processing chamber aligned with the longitudinal axis. The modular processing components include a vortex generator element, an orifice plate element, and/or a raw material injection collar.

The vortex generator element includes an exterior surface, an interior surface, and an interior vortex formation element.

A material inlet is disposed in the exterior surface and configured to communicate a material to the interior vortex formation element via a material channel. The interior vortex formation element processes the material to generate a material vortex within the hollow processing chamber.

The orifice plate element includes an orifice configured to shape the material vortex within the hollow processing chamber. The raw material injection collar includes an exterior edge and a hollow inner surface. The exterior edge includes a material port configured to direct a material into the hollow processing chamber.

In some embodiments, the modular processing components include a mounting plate coupled to an end of the hollow processing chamber. The mounting plate may be configured to mount the plasma generation system to a robotic arm.

In some embodiments, the interior vortex formation element includes a fixed direction vortex formation element or a variable direction vortex formation element. The variable direction vortex formation element may include a tubing element having a plurality of exit pathways communicating with the hollow processing chamber. Each of the exit pathways may extend away from the tubing element at an angle.

In some embodiments, the fixed direction vortex formation element includes multiple plates defining a whorl formation. Each of the plates may be spaced apart from each other by a channel in fluid communication with the hollow processing chamber. In certain embodiments, each of the plates includes a fluted edge disposed along the interior surface. The fluted edge extends in a direction parallel to the longitudinal axis.

In some embodiments, the vortex generator element includes a first vortex generator element oriented in a first orientation and configured to generate a first material vortex, and a second vortex generator element oriented in a second orientation and configured to generate a second material vortex. The first material vortex and the second material vortex are disposed in opposite directions to form a volatile interface layer configured to refine aggregate material into smaller pieces.

According to another aspect of the present disclosure, a method for processing a material includes providing a plasma generation apparatus configured to process a material through a plasma field. The plasma generation apparatus includes a housing element having an outer surface and an inner surface extending cylindrically along a longitudinal axis between a first end and a second end. The outer surface is disposed opposite the inner surface. The plasma generation apparatus includes a plasma reaction chamber having an inner circumference defined by the inner surface and configured to generate a plasma field for processing a material.

Multiple electrode rings are disposed within the plasma reaction chamber and each of the electrode rings includes multiple electrodes. At least a portion of the electrodes corresponding to more than one electrode ring forms an arc path between the first end and the second end.

A power supply is coupled to the outer surface. The power supply includes a plurality of primary coils winding about the outer surface in a direction perpendicular to the longitudinal axis. A secondary coil winds about the primary coils in a direction perpendicular to the longitudinal axis, and a coil core is in contact with at least a portion of each of the primary coils. The secondary coil is configured to induce a voltage on the primary coils.

The method includes actuating the power supply to energize the secondary coil such that arc energy is transmitted along the arc path. The arc energy generates the plasma field within the plasma reaction chamber. The method further includes conveying, through the plasma field, the material for processing.

In some embodiments, the power supply includes an anode disposed near one end of the housing element and a cathode disposed near an opposite end of the plasma reaction chamber. The arc energy is transmitted between the anode and the cathode. In certain embodiments, transmitting the arc energy further includes directing an excess of the arc energy to exit the plasma reaction chamber via one of the first end and the second end.

In some embodiments, the method includes embedding in each of the electrode rings a plurality of piezoelectric crystals configured to harvest the arc energy from the arc path.

In some embodiments, the electrode rings include a plurality of piezoelectric crystals configured to harvest the arc energy from the arc path. In some embodiments, the method includes disposing within the plasma reaction chamber a first electrode ring having a first set of catalysts and a second electrode ring having a second set of catalysts. The first electrode ring may be disposed adjacent to the second electrode ring to facilitate a chemical reaction between the first set of catalysts and the second set of catalysts.

In some embodiments, the method further includes disposing, within a housing having a top plate and a bottom plate, multiple plasma generation apparatuses to form a material processing assembly. The material processing assembly may be configured to process noxious materials in a substantially enclosed environment.

BRIEF DESCRIPTION OF THE DRAWINGS

In the drawings, like elements are depicted by like reference numerals. The drawings are briefly described as follows.

The present disclosure now will be described more fully hereinafter with reference to the accompanying drawings, which show various example embodiments. However, the present disclosure may be embodied in many different forms and should not be construed as limited to the example embodiments set forth herein. Rather, these example embodiments are provided so that the present disclosure is thorough, complete and fully conveys the scope of the present disclosure to those skilled in the art.

DETAILED DESCRIPTION OF THE PREFERRED EMBODIMENTS

As discussed above, traditional approaches to molecular manipulation often involve complex and fragmented setups, requiring multiple components and processes for materials processing. These conventional systems tend to be cumbersome, inefficient, and lack the flexibility needed to adapt to evolving manufacturing requirements and effective use in situ. The present disclosure addresses these and other issues.

As used herein, the term "plasma" refers to a state of matter including ionized gas particles consisting of a mixture of positively charged ions and free electrons. As used herein, the term "material" refers to any solid, liquid, gas, aggregate, or combination thereof. As used herein, the term "process material" refers to any material introduced into a disclosed apparatus and/or system for processing.

Figure 1:
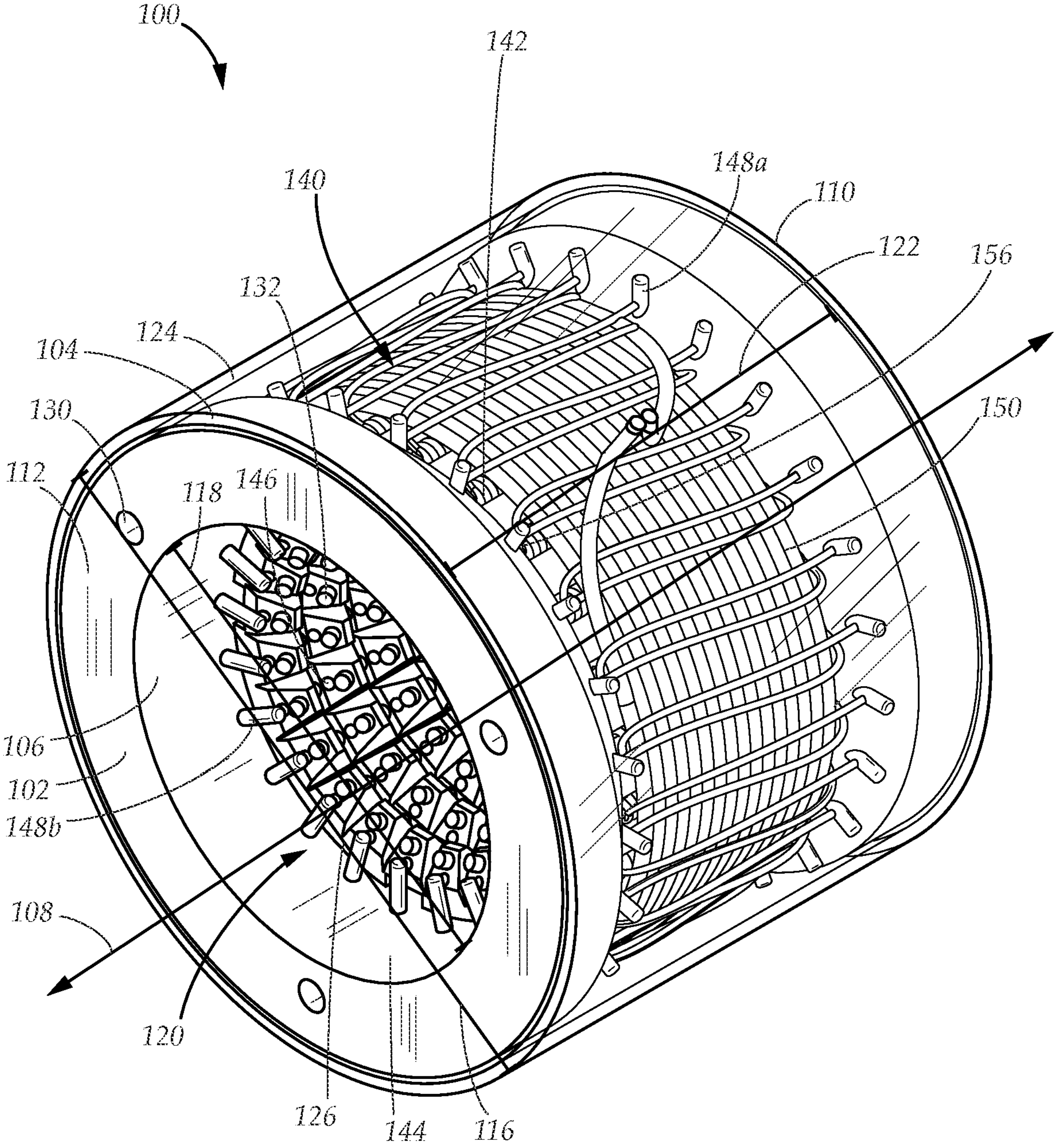
FIG. 1 is a perspective view of a plasma generation apparatus having a housing element, a plasma reaction chamber, electrode rings, and a power supply in accordance with some embodiments of the present disclosure.
Figure 2:
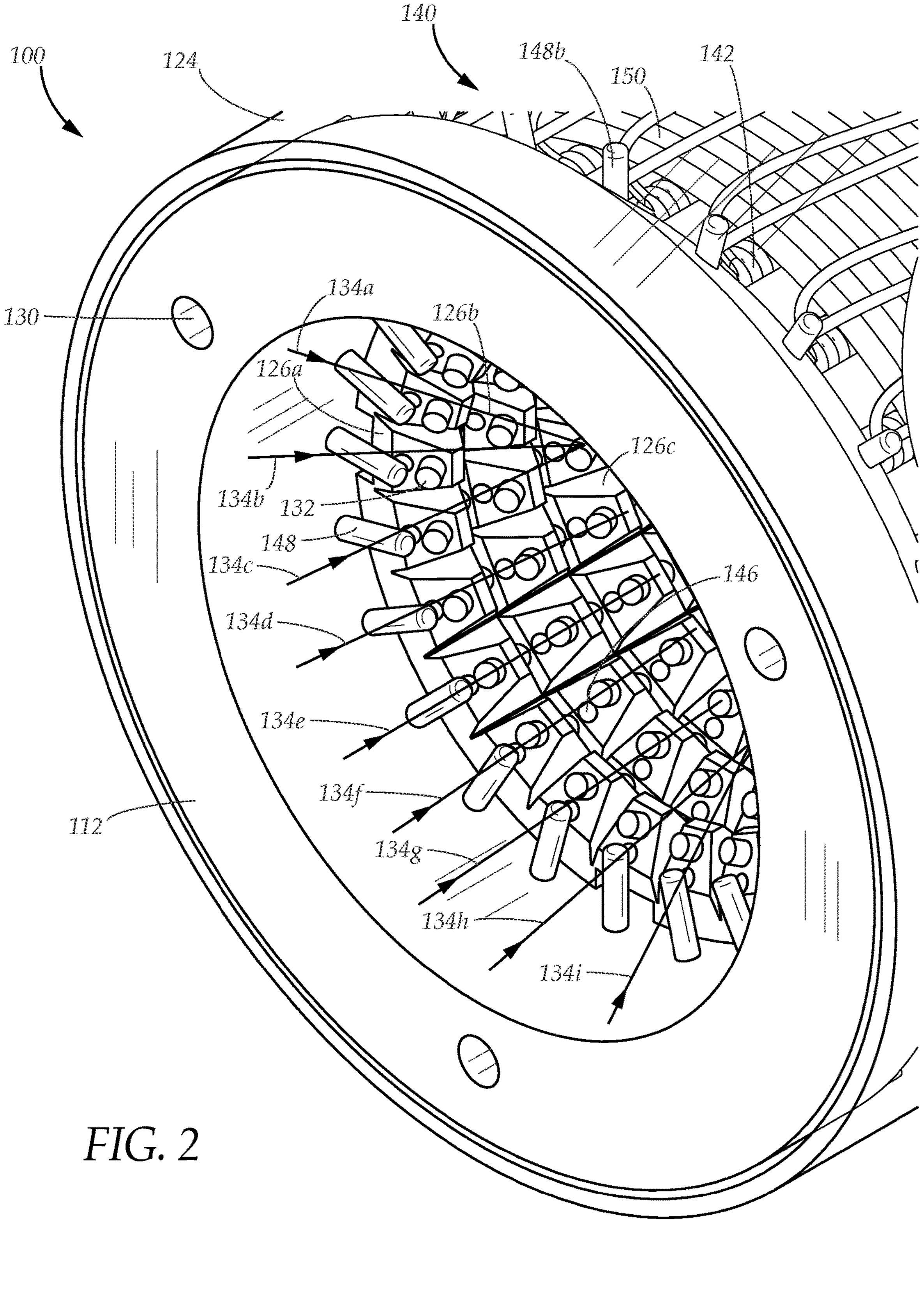
FIG. 2 is an end perspective view of the plasma generation apparatus of FIG. 1.

Referring now to FIGS. 1 and 2, a plasma generation apparatus 100 is configured to generate a plasma field for the conversion and/or molecular manipulation of various materials. The plasma generation apparatus 100 may be configured to process any solid, liquid, gas, aggregate, and/or any other suitable material or combination thereof.

In some embodiments, the plasma generation apparatus 100 is utilized in connection with carbon conversion to energy at direct air capture ("DAC") facilities to provide on-site carbon dioxide conversion to electrical energy without concomitant storage, transport, and processing requirements. In some embodiments, the plasma generation apparatus 100 is used to provide cement sintering, large scale 3D printing, catalytic converter replacement, on-demand water heating systems, and the like. In one embodiment, for example, the plasma generation apparatus 100 is used as a catalytic converter replacement for internal combustion engines by placing the plasma generation apparatus 100 in the exhaust line of an internal combustion engine to eliminate unwanted molecular compounds. In some embodiments, the plasma generation apparatus 100 is used to generate superconductors like carbon nanotubes or other structural tubes and fibers out of materials such as carbon dioxide, coal ash, graphite, or other raw materials.

In some embodiments, the plasma generation apparatus 100 is used as a steam generator. Materials such as water, hydrogen, and/or other combustibles may pass through the plasma generation apparatus 100. The combustibles may ignite, thereby superheating the water. In some embodiments, this process provides an alternate energy source to coal while supplying the steam powered electricity generator with steam.

Beneficially, various embodiments of the plasma generation apparatus 100 may convert carbon dioxide and/or other noxious gases into viable products without necessitating transportation. Various embodiments of the plasma generation apparatus 100 may thus facilitate manufacturing, scalability, cost-effectiveness, adaptability, and deployment of beneficial systems in various industries.

In some embodiments, the plasma generation apparatus 100 includes a housing element 102 configured to house one or more additional components, as discussed in more detail below. In some embodiments, the housing element 102 provides a substantially rigid core structure optimized for efficient plasma generation and containment.

In some embodiments, the housing element 102 is defined by an inner surface 106 extending substantially cylindrically along a longitudinal axis 108 between a first end 110 and a second end 112. The first end 110 and/or the second end 112 may include one or more connection elements 130 configured to couple to another modular processing component (not shown). The connection elements 130 may include apertures, holes, projections, grooves, recesses, hooks, clips, rivets, grommets, and/or any other suitable elements or features.

Precise dimensions of the housing element 102 may vary based on specific plasma generation requirements. In some embodiments, the housing element 102 includes any suitable durable, heat-resistant, inert material configured to withstand high temperatures and corrosive environments. In some embodiments, the housing element 102 is constructed of one or more insulating materials. In certain embodiments, the housing element 102 includes one or more materials with high thermal conductivity to facilitate rapid heat dissipation during plasma reactions. For example, in some embodiments, the housing element 102 includes alumina, silicon nitride, quartz, high-grade ceramic, metal alloy, composites thereof, and/or any other material having suitable thermal and mechanical properties.

In some embodiments, the inner surface 106 of the housing element 102 defines a plasma reaction chamber 120 configured to generate a plasma field for processing a material. The inner surface 106 may be substantially smooth, or may include one or more grooves, channels, recesses, projections, and/or other suitable features configured to facilitate the even distribution of plasma ions and radicals. In some embodiments, one or more features of the inner surface 106 is configured to engage an electrode ring **126*a*-126*c* disposed within the plasma reaction chamber 120. Each electrode ring 126*a*-126*c* may include a plurality of electrodes 132 configured to define at least one arc path 134*a*-134*i* extending along an inside wall 144 of the plasma reaction chamber 120 between the first end 110 and the second end 112**.

Figure 3:
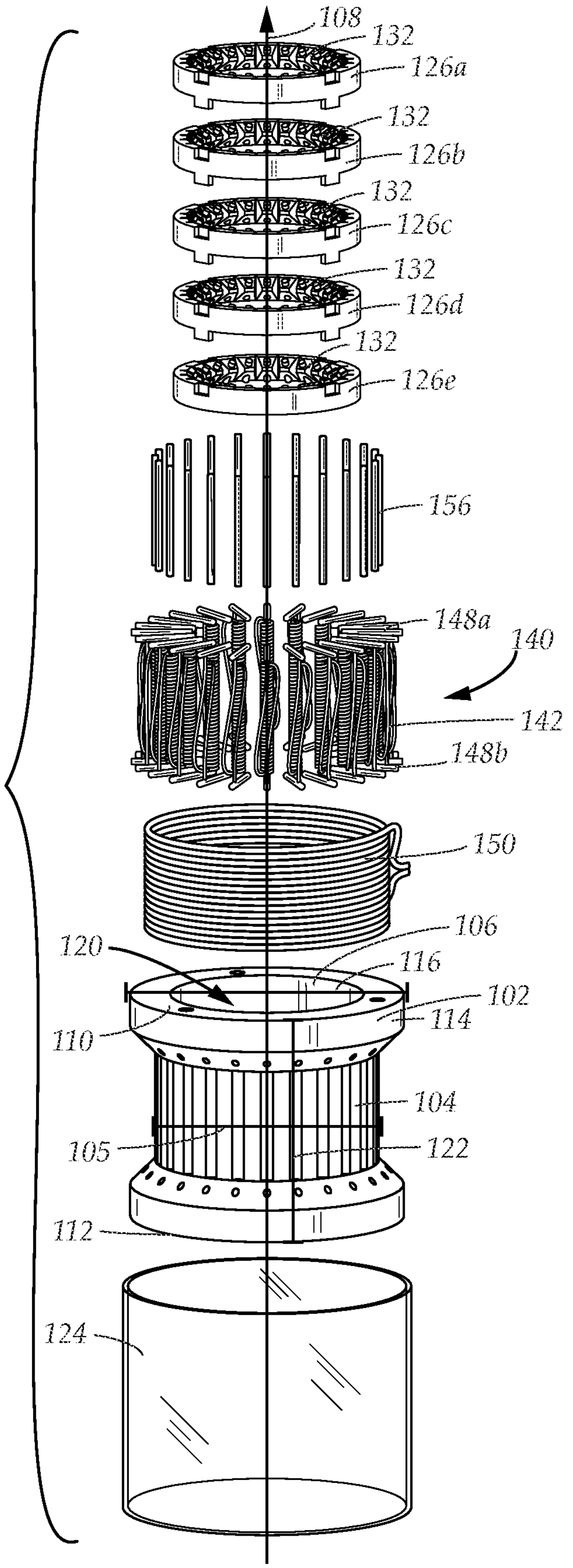
FIG. 3 is an exploded perspective view of one embodiment of the plasma generation apparatus in accordance with some embodiments of the present disclosure.

Referring now to FIG. 3, while still referring to FIG. 1, a centralized power supply 140 may be coupled to the outer surface 104 of the housing element 102 such that the power supply 140 is maintained between the first end 110 and the second end 112. The power supply 140 may be configured to transmit electrical energy to at least one of the electrode rings **126*a*-126*e* disposed in the plasma reaction chamber 120. In some embodiments, the power supply 140 is an inductive power supply 140 configured to utilize electromagnetic induction to generate and control a plasma field within the plasma reaction chamber 120**.

In some embodiments, a protective sleeve 124 is disposed over the outer surface 104 of the housing element 102 to cover the power supply 140. The protective sleeve 124 may include, for example, silicone rubber, neoprene, polyvinyl chloride ("PVC"), polyurethane ("PU"), fluoropolymers, fiberglass sleeving, ceramic fiber sleeving, nomex, and/or the like.

In some embodiments, the power supply 140 may include a plurality of primary coils 142 winding about the outer surface 104 of the housing element 102 in a direction perpendicular to the longitudinal axis 108. In some embodiments, the plurality of primary coils 142 is configured to provide precise control over arc paths 134 extending along an inside wall 144 of the plasma reaction chamber 120. In certain embodiments, each of the primary coils 142 is associated with a single arc path **134*a*-134*i*. In other embodiments, a primary coil 142 is associated with more than one arc path 134*a*-134*i***.

In some embodiments, each of the primary coils 142 winds about a coil core 156 in a direction substantially perpendicular to the longitudinal axis 108. The coil core 156 may be made of a ferromagnetic material such as iron, ferrite, iron alloy, ferronickel, ferro-aluminum, ferro cobalt, or any other suitable ferromagnetic material or combination thereof. In certain embodiments, the coil core 156 enhances induction of a magnetic field and ensures optimal coupling between the primary coils 142 and a secondary coil 150 where the secondary coil 150 is wound about the primary coils 142 in a direction perpendicular to the longitudinal axis 108. In some embodiments, the secondary coil 150 is positioned to induce a voltage on the primary coils 142. As electrons flow through the primary coils 142, the electrons travel down an arc path **134*a*-134*i* formed between adjacent electrodes 132. In some embodiments, the arc path 134*a*-134*i* extends along a wall 144 of the plasma reaction chamber 120** to create an arc.

In some embodiments, the power supply 140 includes an anode **148*a* and a cathode 148*b* disposed near the first and the second ends 110, 112, respectively, of the housing element 102. In certain embodiments, the anode 148*a* is coupled to one end of a primary coil 142 and the cathode 148*b* is connected to an opposite end of the primary coil 142. In some embodiments, at least a portion of the anode 148*a* and/or the cathode 148*b* is configured to extend through the housing element 102 between the outer surface 104 and the inner surface 106. In certain embodiments, the anode 148*a* and the cathode 148*b*** are interchangeable such that a direction of current flow may be changed or reversed as desired.

In one embodiment, the plurality of primary coils 142 provide a first circuit path, while the secondary coil 150 is wound over the primary coils 142 to form a second circuit path. In this manner, each coil 142, 150 constitutes its own circuit path. This unique configuration ensures optimal energy transfer and control, enabling precise manipulation of molecular interactions within the plasma reaction chamber 120.

In some embodiments, the power supply 140 is actuated via a control interface (not shown) to initiate and regulate the flow of electrical energy into the plasma reaction chamber 120. In some embodiments, the control interface (not shown) includes various physical controls configured to actuate and control power directly, such as buttons, switches, knobs, or the like. In other embodiments, the control interface (not shown) includes digital controls such as touchscreens and/or software. In some embodiments, the control interface (not shown) provides remote control capabilities. In these and other embodiments, the control interface (not shown) may be configured to enable a user to adjust parameters such as voltage, current, frequency, power modulation, and/or the like. In some embodiments, the power supply 140 is connected to a dedicated power switch that enables power to be turned on or off.

Figure 4:
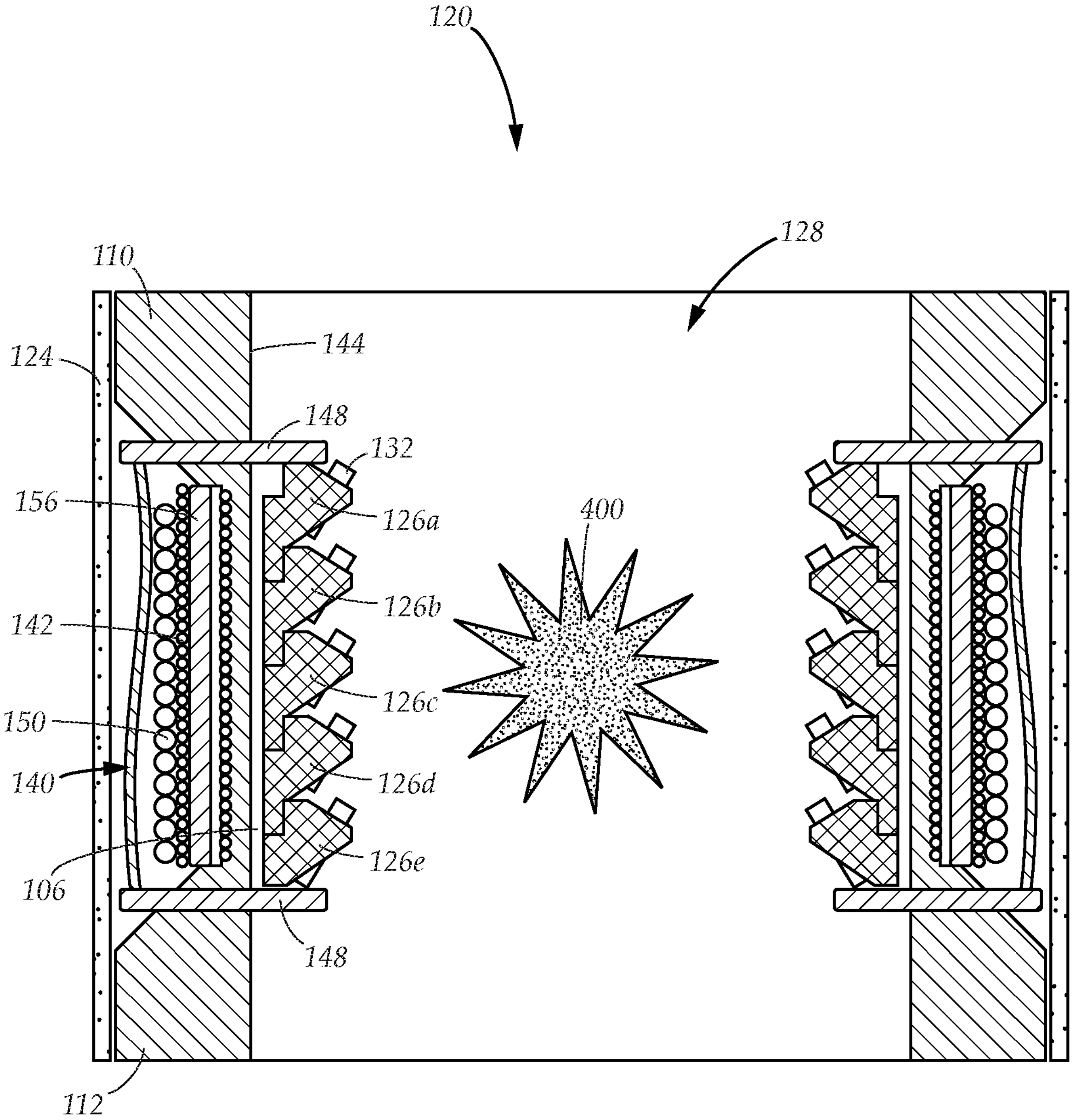
FIG. 4 is a cross-sectional view of one embodiment of the plasma generation apparatus showing plasma generated within the plasma reaction chamber in accordance with some embodiments of the present disclosure.

Referring now to FIG. 4, in operation, actuating the power supply 140 initiates a flow of electrical current through the secondary coil 150 which induces a voltage on the primary coils 142. The input power requirements may be varied by using alternating current or direct current, and/or by varying amperage, voltage, frequency, and/or energy pulse profiles.

This electrical current flow through the secondary coil 150 may generate a magnetic field that extends into the plasma reaction chamber 120 and induces a plasma field 400. The plasma field 400 may include a corona plasma field 400 or a microwave plasma field 400, for example, depending on the incoming power communicated to the power supply 140. The voltage potential difference between the anode 148*a* and the cathode 148*b* within the plasma reaction chamber 120 results in energized electrons arcing down the electrodes 132 of the electrode rings 126*a*-126*e*. In these and other embodiments, the arcing electrodes 132 create arc paths 134 extending between the first end 110 and the second end 112. In some embodiments, the arc paths 134 excite gas molecules within the plasma reaction chamber 120 to produce the plasma field 400.

In some embodiments, such as where the incoming power is alternating current, the plasma field 400 generated vibrates or oscillates at some factor of the incoming power frequency. In this manner, incoming power parameters may be set or adjusted to produce a plasma field 400 having a specific oscillating frequency sufficient to break down a target molecule.

Upon establishing the plasma field 400 within the plasma reaction chamber 120 having the desired characteristics, a material to be processed may be introduced into a portion of the plasma reaction chamber 120 corresponding to the first or second end 110, 112 of the housing element 102. In some embodiments, the electrons in the plasma field 400 interact with the process material as it is conveyed through the plasma reaction chamber 120. In this manner, the plasma reaction chamber 120 may facilitate various physical and/or chemical processes such as etching, deposition, surface modification, and/or the like as the material is conveyed therethrough.

In some embodiments, an excess of electrons or arc energy may be directed to exit the plasma reaction chamber 120 via the first or second end 110, 112 of the housing element 102. In some embodiments, this excess energy may be dissipated as heat or through other mechanisms to prevent overheating power supply 140 components and to maintain stable operation of the plasma field 400.

Figure 6:
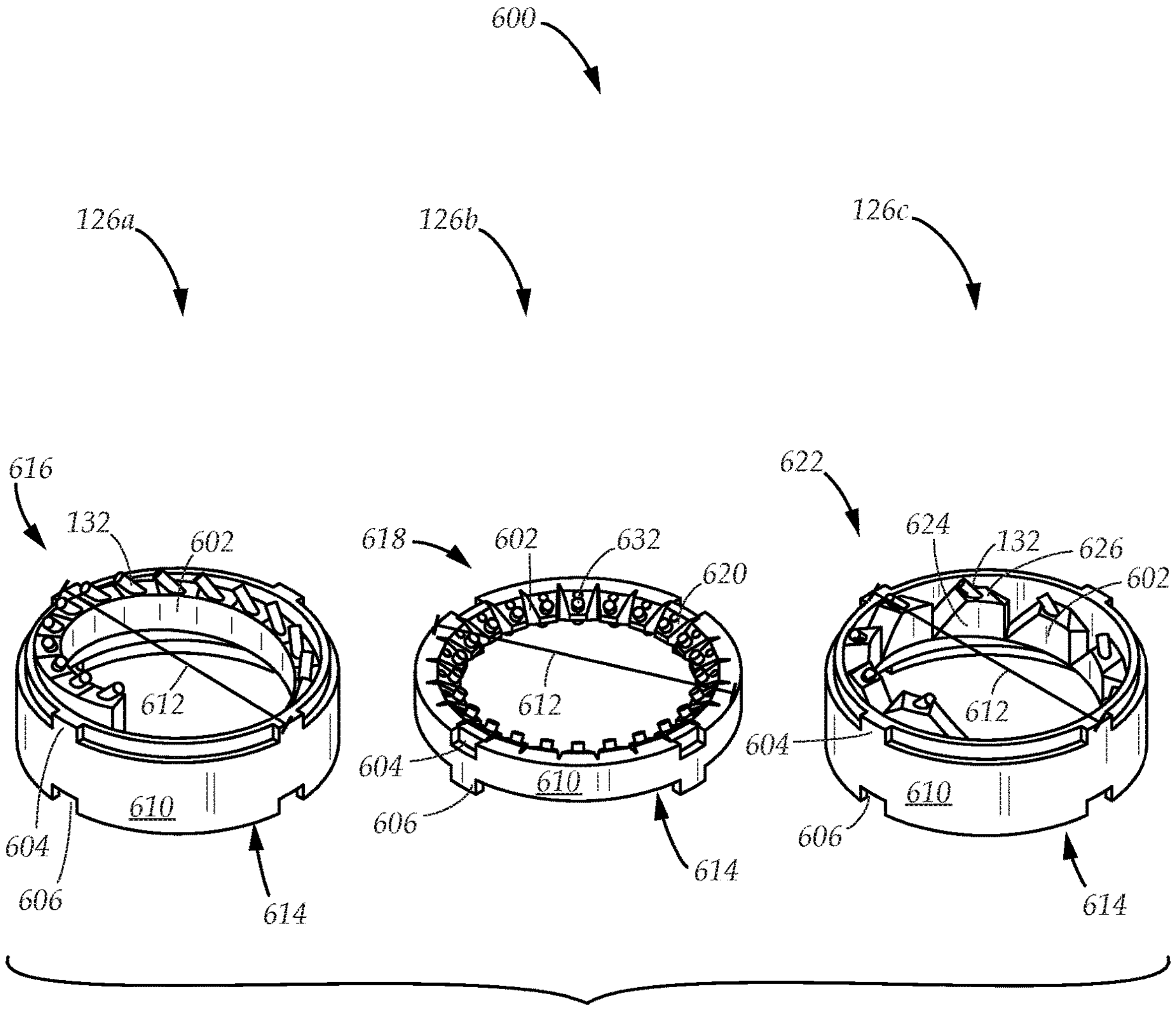
FIG. 6 is a top perspective view of multiple electrode rings having various ring profile geometries in accordance with some embodiments of the disclosure.

Referring now to FIGS. 3 and 4, while also referring to FIG. 6, one or more modular electrode rings 126*a*-126*e* may be configured to fit within the plasma reaction chamber 120 to generate and sustain a plasma field 400. In certain embodiments, one or more of the electrode rings 126*a*-126*e* includes an outer surface 610 having an outer diameter 612 substantially corresponding to an inner diameter 118 of the plasma reaction chamber 120. In some embodiments, the outer surface 610 may be configured to engage one or more features of the inner surface 106 to secure a position of the electrode ring 126*a*-126*e* within the plasma reaction chamber 120. For example, in certain embodiments, the outer surface 610 may include one or more projections, grooves, recesses, or other features configured to mechanically engage corresponding features of the inner surface 106. In other embodiments, one or more of the electrode rings 126*a*-126*e* may be configured to couple to the inner surface 106 via a press fit.

Figure 5A:
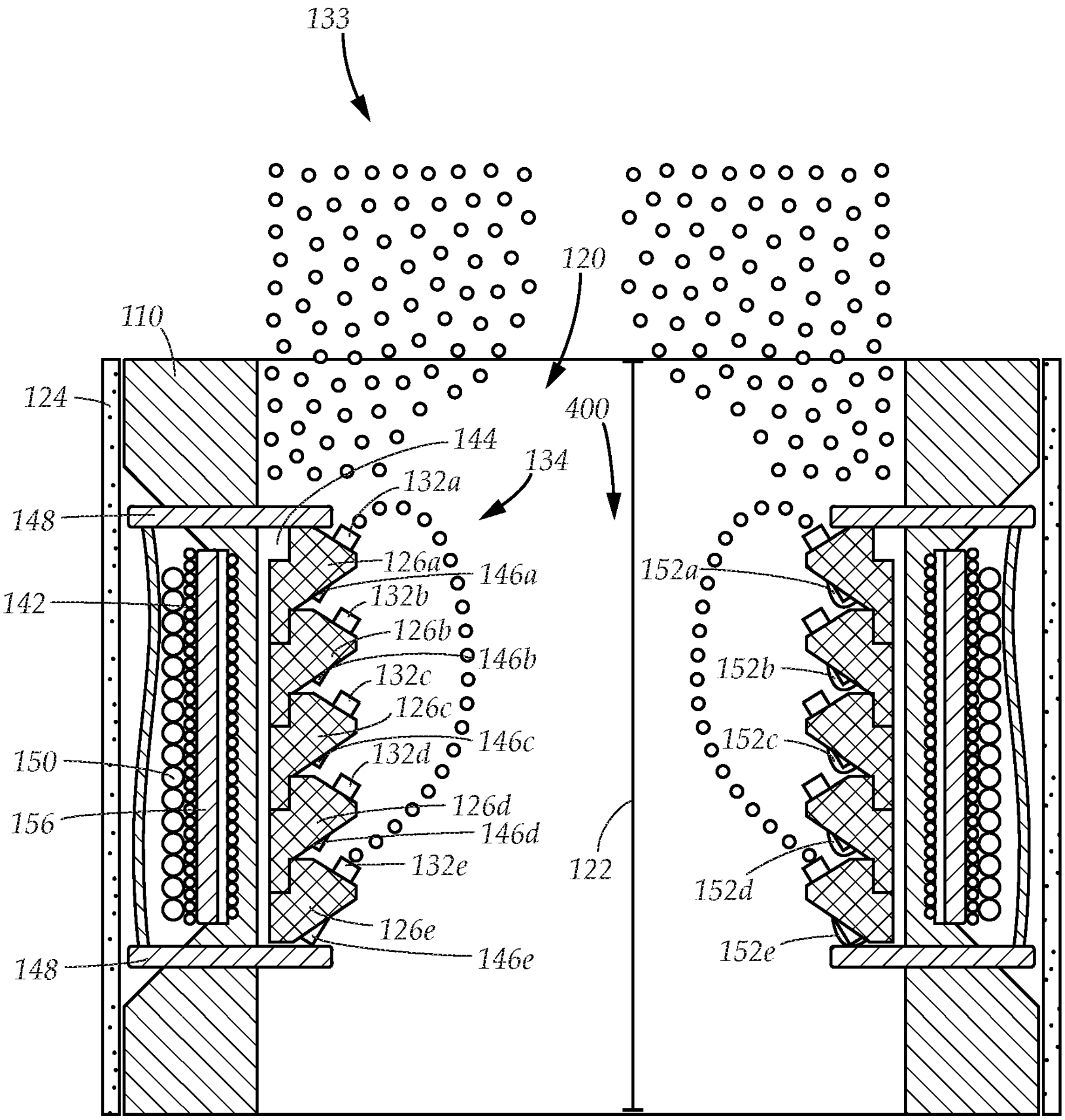
FIG. 5A is a cross-sectional view of the plasma generation apparatus of FIG. 4 illustrating representative arc paths in accordance with some embodiments of the disclosure.
Figure 5B:
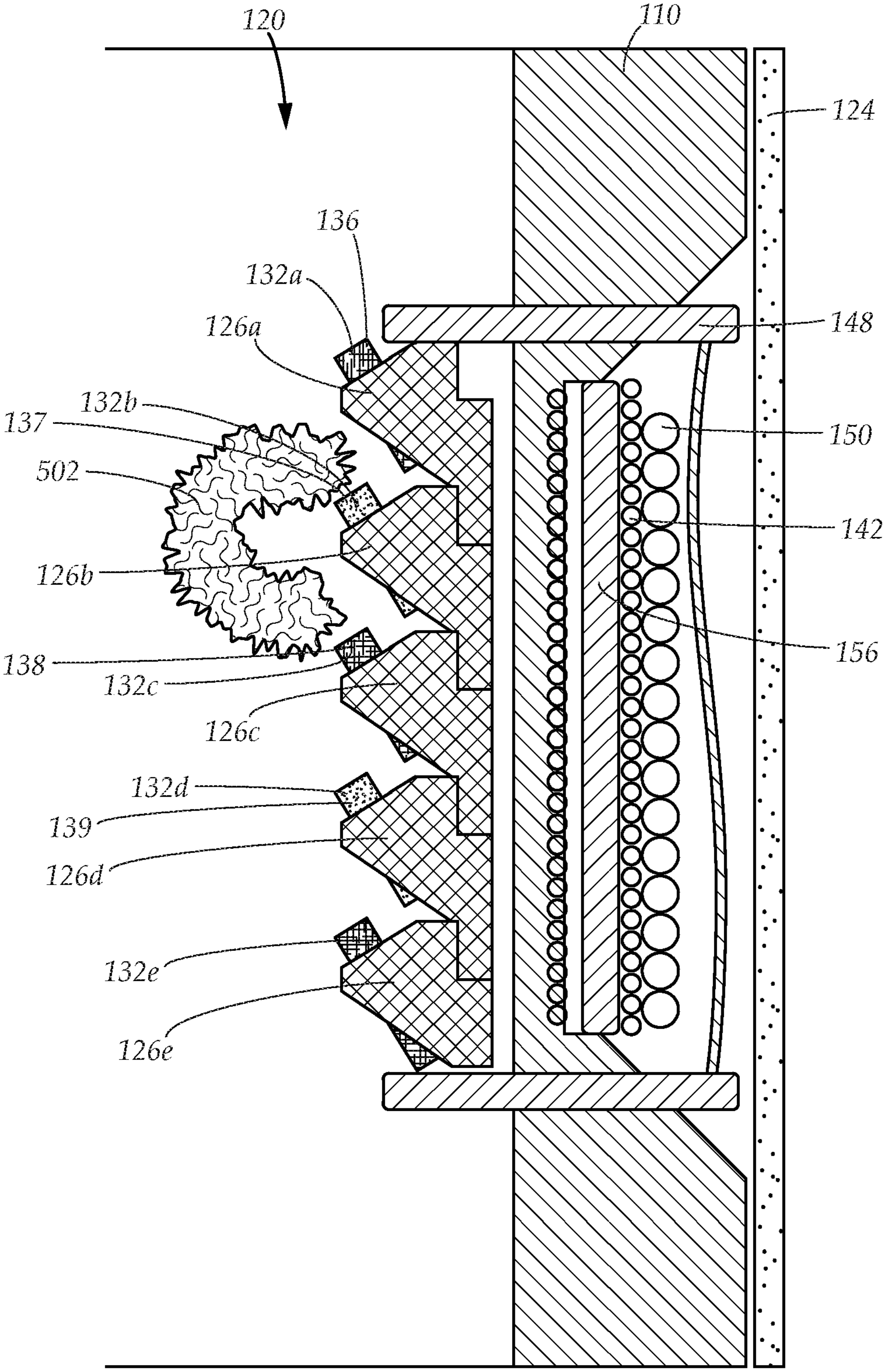
FIG. 5B is a side cross-sectional view of multiple electrode rings disposed in the plasma reaction chamber, illustrating a chemical reaction between a set of catalysts embedded in one electrode ring and another set of catalysts embedded in an adjacent electrode ring, according to various embodiments of the disclosure.

Referring now to FIGS. 5A and 5B, while also referring to FIG. 6, in certain embodiments, the ring profile geometries 600 of each of the electrode rings 126*a*-126*e* are modular such that adjacent electrode rings 126*a*-126*e* are interchangeable and configured to fit closely together within the plasma reaction chamber 120. In some embodiments, the ring profile geometries 600 of adjacent electrode rings 126*a*-126*e* include corresponding features 604, 606 configured to engage and/or interlock with one another. For example, in one embodiment, one or more electrode rings 126*a*-126*e* may include one or more flanges, projections, or other features 604 configured to engage with one or more grooves, recesses, or other corresponding features 606 disposed in an adjacent electrode ring 126*a*-126*e*.

In these and other embodiments, the various ring profile geometries 600 facilitate rearranging and/or replacing one or more electrode rings 126*a*-126*e* as desired. In this manner, the plasma reaction chamber 120 can be easily configured to accommodate diverse manufacturing processes and requirements. For example, in some embodiments, this modularity enables the plasma generation apparatus 100 to be tailored to specific applications in situ, including semiconductor fabrication, carbon dioxide sequestering, water purification, and/or utilities management.

In some embodiments, each of the electrode rings 126*a*-126*e* may include a plurality of electrodes 132 coupled thereto or integrated therewith. Within each of the electrode rings 126*a*-126*e*, multiple electrodes 132 may be configured to initiate plasma discharge and/or to sustain a plasma field 400. In some embodiments, the electrodes 132 are fabricated from materials with high electrical conductivity and thermal stability to withstand the intense heat and electrical currents associated with plasma generation. In some embodiments, one or more electrodes 132 includes tungsten, copper, graphite, molybdenum, stainless steel, ceramic, and/or any other suitable material or metal alloy.

In some embodiments, at least one of the electrode rings 126*a*-126*e* includes a unique electrode 132 alloy to enable the plasma generation apparatus 100 to target several gases or other suitable materials at once. In some embodiments, the modularity of electrode rings 126*a*-126*e* having various electrode 132 alloys facilitates multiple stages of targeted reactions.

In some embodiments, the electrodes 132 are arranged symmetrically or asymmetrically along an inside circumference of the electrode ring 126*a*-126*e*, depending on desired plasma characteristics. In certain embodiments, multiple electrode rings 126*a*-126*e* are disposed adjacent to one another in series within the plasma reaction chamber 120. In some embodiments, the electrodes 132 of a series of electrode rings 126*a*-126*e* may substantially align along the length 122 of the plasma reaction chamber 120. In these and other embodiments, the electrodes 132 form arc paths 134 extending between the first end 110 and the second end 112 of the plasma reaction chamber 120. In some embodiments, one or more arc paths 134 extend in a direction substantially parallel to the longitudinal axis 108.

In some embodiments, one or more of the electrode rings 126*a*-126*e* is configured to oscillate within the plasma reaction chamber 120 in response to arc energy 133 transmitted along the arc path 134. This oscillatory motion may enhance plasma mixing and promote uniformity of plasma distribution within the plasma reaction chamber 120. In some embodiments, one or more of the electrode rings 126*a*-126*e* may include magnetic fields and/or piezoelectric crystals 146*a*-146*e* to achieve such oscillations.

In some embodiments, a plurality of piezoelectric crystals 146 may be integrated into one or more of the electrode rings 126*a*-126*e* to harvest the arc energy 133 generated during plasma discharge. In some embodiments, these piezoelectric crystals 146*a*-146*e* are configured to convert mechanical vibrations from the oscillating electrode rings 126*a*-126*e* into electrical energy. In certain embodiments, the arc path 134 extends over the piezoelectric crystals 146*a*-146*e* to maximize harvesting efficiency.

In some embodiments, a protective covering 152*a*-152*e* made of an electrically-insulating material may be disposed over the piezoelectric crystals 146*a*-146*e* to prevent electrical arcing and promote their longevity. The protective covering 152*a*-152*e* may be configured to withstand high temperatures, chemical reactivity, mechanical stresses, and other harsh conditions associated with plasma generation processes. In certain embodiments, the protective covering 152*a*-152*e* may include alumina, silicon nitride, polyimide, polytetrafluoroethylene ("PTFE"), boron nitride ("BN"), or any other suitable ceramic or other suitable material.

In some embodiments, the plasma reaction chamber 120 includes a length 122 tailored to accommodate a selected arrangement and/or number of electrode rings 126*a*-126*e*. In other words, the dimensions and number of electrode rings 126*a*-126*e* may define the length 122 of the plasma reaction chamber 120. The length 122 of the plasma generation apparatus 100 may be extended or reduced, depending on the selected number of electrode rings 126*a*-126*e*. In some embodiments, the length 122 of the plasma reaction chamber 120 is at least slightly greater than the combined length of the electrode rings 126*a*-126*e* to allow for their oscillatory movement.

Referring now to FIG. 5B, in certain embodiments, one or more electrodes 132*a*-132*c* includes or is embedded or doped with selected catalyst materials 136 to facilitate one or more desired chemical reactions within the plasma reaction chamber 120. In certain embodiments, catalyst materials 136 are selected to facilitate specific chemical reactions within the plasma reaction chamber 120. The catalyst materials 136 may enhance the efficiency and selectivity of desired chemical transformations within the plasma reaction chamber 120.

Depending on the desired reaction pathways and target product, various catalyst materials 136 may be used. For example, in some embodiments, metal nanoparticles such as palladium and/or platinum may be used to catalyze polymerization reactions by initiating radical formation and cross-linking of monomer molecules within the plasma field 400. In some embodiments, catalyst materials 136 include iron, nickel, and/or cobalt nanoparticles to serve as catalysts for the decomposition of carbon-containing precursors such as methane or ethylene. In these and other embodiments, the catalyst materials 136 facilitate the growth of carbon nanotubes via catalytic chemical vapor deposition ("CVD") mechanisms.

In some embodiments, catalyst materials 136 may include metal catalysts such as platinum supported on alumina or other suitable metal catalysts selected to facilitate hydrogenation of organic compounds. In other embodiments, catalyst materials 136 include transition metal catalysts such as iron, ruthenium, or the like, to catalyze the conversion of nitrogen and hydrogen gases into ammonia under high-temperature plasma conditions. In certain embodiments, catalyst materials 136 include metal oxide catalysts such as titanium dioxide, cerium oxide, or other suitable metal oxides to facilitate the oxidation or reduction of volatile organic compounds or other harmful gases. In some embodiments, catalyst materials 136 include noble metal catalysts such as platinum-rhenium catalysts supported on electrodes 132 made of alumina, silica, or another suitable material to enhance activation and conversion of hydrocarbon molecules.

In some embodiments, the catalyst embedding process involves incorporating catalytic nanoparticles or coatings onto one or more surfaces of the electrodes 132*a*-132*c*. In other embodiments, one or more of the catalyst materials 136 is embedded or otherwise included directly in the electrode ring 126*a*-126*e*. In these and other embodiments, the catalyst materials 136 are configured to promote desired chemical reactions during plasma generation processes.

In some embodiments, one electrode ring 126*b* includes a first set of catalysts 137 and an adjacent electrode ring 126*c* includes a second set of catalysts 138. In other embodiments, adjacent electrode rings 126*a-c* include identical sets of catalysts. In some embodiments, adjacent electrode rings 126*b*, 126*c* are selected to facilitate a chemical reaction between the first set of catalysts 137 and the second set of catalysts 138. Similarly, in some embodiments, another electrode ring 126*d* disposed next to the adjacent electrode ring 126*c* includes a third set of catalysts 139. In some embodiments, the third set of catalysts 139 is identical to the first set of catalysts 137. In other embodiments, the third set of catalysts is unique relative to the first and second sets of catalysts 137, 138. This third electrode ring 126*d* may be selected to facilitate a chemical reaction between the second set of catalysts 138 and the third set of catalysts 139, thereby causing a cascade of desired chemical reactions within the plasma reaction chamber 120.

Referring now to FIG. 6, while also referring to FIGS. 5A and 5B, in some embodiments, the ring profile geometry 600 of each electrode ring 126*a*-126*e* varies based on specific application requirements, such as plasma volume, gas flow dynamics, reaction kinetics, and/or the like. In some embodiments, a ring profile geometry 600 may be selected to guide the flow of plasma precursor gases towards a center of the plasma reaction chamber 120. In other embodiments, ring profile geometries 600 of various electrode rings 126*a*-126*e* are selected to control various aspects of plasma behavior such as density, temperature, and composition. In certain embodiments, ring profile geometries 600 of the electrode rings 126*a*-126*e* may ensure efficient utilization of precursor gases and promote uniform plasma discharge throughout the plasma reaction chamber 120.

In certain embodiments, the electrode rings 126*a*-126*e* are modular such that the ring profile geometry 600 of one electrode ring 126*a*-126*e* is configured to conform to and/or couple to the ring profile geometry 600 of an adjacent electrode ring 126*a*-126*e*. In some embodiments, this modularity facilitates replacing and reconfiguring the electrode rings 126*a*-126*e* within the plasma reaction chamber 120 as desired. In some embodiments, the relative positions and/or number of electrode rings 126*a*-126*e* disposed within the plasma reaction chamber 120 may be selectively varied to achieve a specific purpose.

In one embodiment, for example, a first electrode ring 126*a* includes an electrode support element 602 having a ring profile geometry 600 including at least a portion of a helix 616 inscribed within a circumference 614 of the electrode ring 126*a*. In some embodiments, the electrode support element 602 includes multiple electrodes 132 disposed adjacent to each other in series along the helix 616. One or more electrodes 132 may include, for example, tungsten and/or any other suitable metal alloy or other suitable material.

In some embodiments, another electrode ring 126*b* has a ring profile geometry 600 including a substantially circular configuration 618 inscribed within the circumference 614 of the electrode ring 126*b*. In some embodiments, the circular configuration 618 includes a series of side-by-side projections 620 where each projection 620 includes at least one electrode 132. One or more of the projections 620 may be disposed at an angle relative to the circumference 614. One or more electrodes 132 may include, for example, tungsten and/or any other suitable metal alloy or other suitable material.

In some embodiments, an electrode ring 126*c* includes a ring profile geometry 600 with a substantially stepped configuration 622 inscribed within the circumference 614 of the electrode ring 126*c*. In some embodiments, the stepped configuration 622 includes a series of steps 624 inscribed around the circumference 614 in series such that each step 624 is spaced apart from each other step 624 and the steps 624 are substantially evenly distributed around the circumference 614. Each of the steps 624 may include at least one electrode 132 coupled to its top surface 626. One or more electrodes 132 may include, for example, tungsten and/or any other suitable metal alloy or other suitable material.

Figure 7:
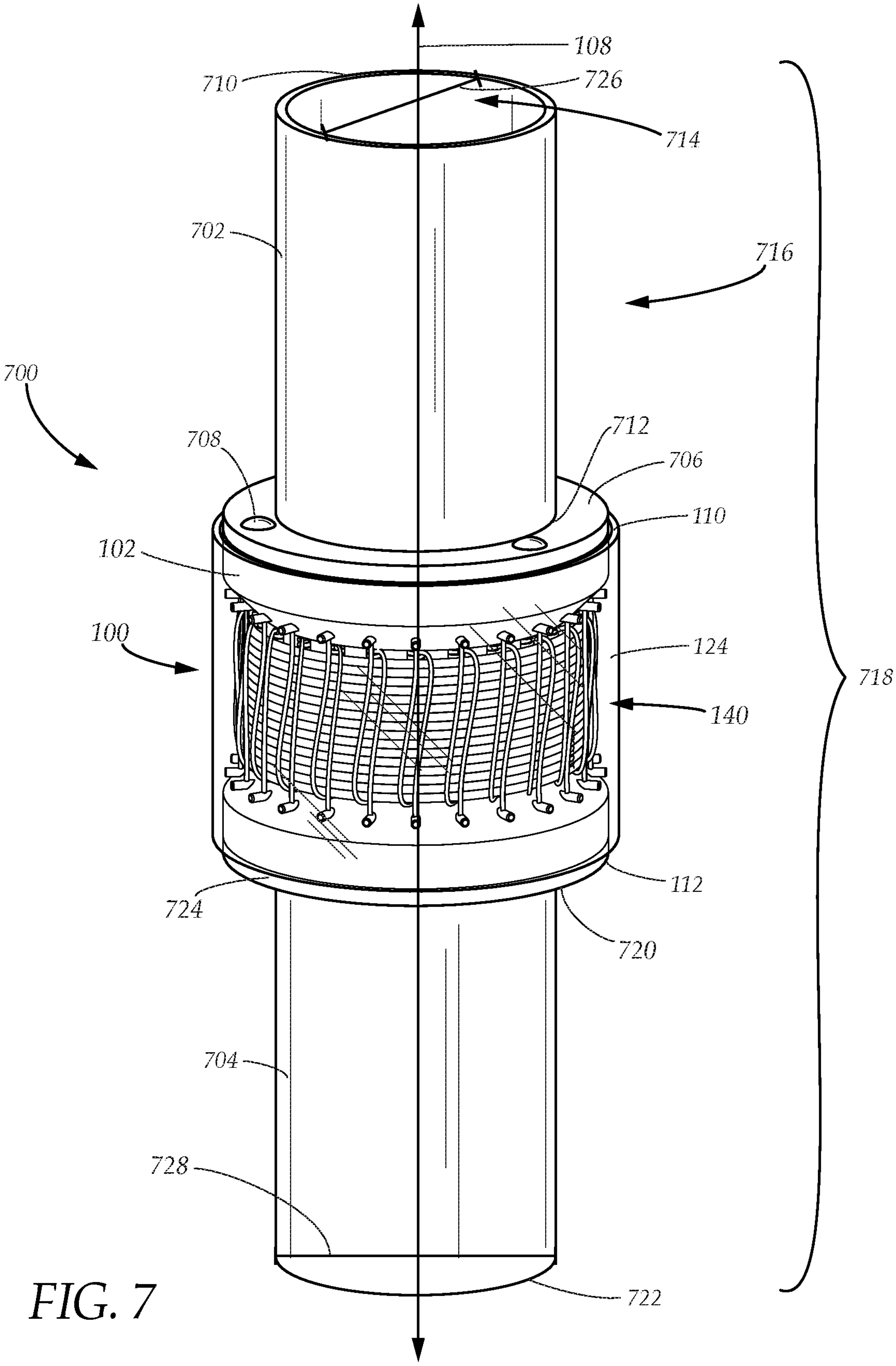
FIG. 7 is a perspective view of a plasma generation system incorporating a plasma generation apparatus in accordance with certain embodiments of the present disclosure.

Referring now to FIG. 7, while also referring to FIG. 1, in some embodiments, a plasma generation system 700 includes another plasma generation apparatus 100 that includes a housing element 102, a plasma reaction chamber 120, a plurality of electrode rings 126*a*-126*e*, and a power supply 140, which are substantially similar to those described above in relation to the plasma generation apparatus 100 of FIGS. 1-6. In various embodiments, the plasma generation system 700 further includes one or more modular processing components 716, which are described below.

In some embodiments, the modular processing components 716 are coupled to the plasma generation apparatus 100 and aligned along the longitudinal axis 108 such that the plasma generation apparatus 100 and the modular processing components 716 form a hollow processing chamber 718. In certain embodiments, at least a portion of the hollow processing chamber 718 is substantially contiguous with the plasma reaction chamber 120. The modular processing components 716 may be coupled to at least one of the first end 110 and the second end 112 of the plasma generation apparatus 100 via one or more mechanical fastening devices or techniques such as screws, bolts, rivets, grommets, welding, adhesives, and/or the like.

In one embodiment, the modular processing components 716 include an inlet tube 702 and an outlet tube 704. In some embodiments, the inlet tube 702 is substantially cylindrical and extends between a first end 710 and a second end 712. In some embodiments, the inlet tube 702 includes a flange 706 extending substantially transversely from the second end 712. At least a portion of the flange 706 may be configured to couple to the first end 110 of the plasma generation apparatus 100.

Similarly, the outlet tube 704 may extend substantially cylindrically between an upper end 720 and a lower end 722. The upper end 720 of the outlet tube 704 may include a flange 724 extending in a perpendicular direction relative to the longitudinal axis 108. At least a portion of the flange 724 may be configured to couple to the second end 112 of the plasma generation apparatus 100.

In some embodiments, a diameter 728 of the outlet tube 704 may be substantially identical to a diameter 726 of the inlet tube 702. In these and other embodiments, the diameter 726 of the inlet tube 702 and the diameter 728 of the outlet tube 704 may be identical to or less than a diameter 116 of the plasma generation apparatus 100. In this manner, the inlet tube 702, the plasma generation apparatus 100, and the outlet tube 704 may form a substantially contiguous hollow processing chamber 718. In operation, in certain embodiments, one or more suitable materials may be introduced into the first end 710 of the inlet tube 702, may be conveyed through the hollow processing chamber 718 for processing, and may exit through the lower end 722 of the outlet tube 704.

In some embodiments, the plasma generation system 700 is configured to facilitate high volume processing of gases, liquids, and/or aggregate materials. In some embodiments, for example, the hollow processing chamber 718 is configured to process water and/or waste water to ablate or destroy unwanted molecular compounds such as per- and polyfluoroalkyl substances ("PFAS") and other compounds and bioburdens. In some embodiments, the hollow processing chamber 718 facilitates superheating the water or other medium or material that passes through the plasma generation system 700.

Figure 8:
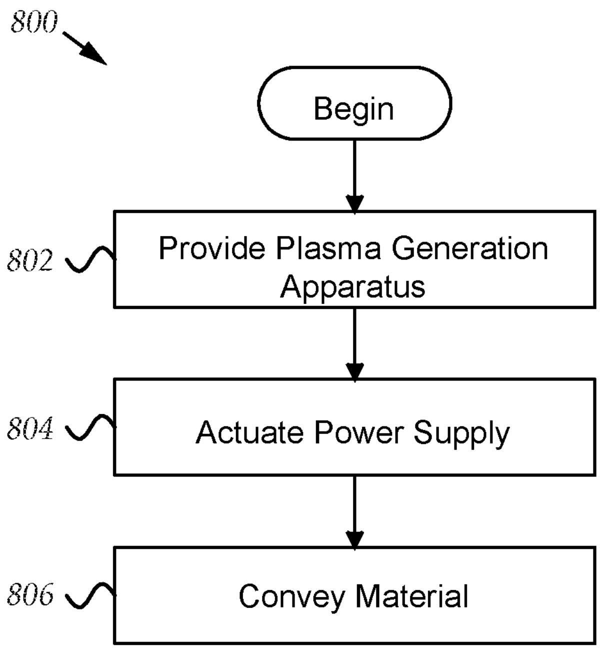
FIG. 8 is a schematic flow chart diagram of a method for processing a material in accordance with various embodiments of the present disclosure.

Referring now to FIG. 8, while also referring to FIGS. 1 and 2, according to another aspect of the present disclosure, a method 800 for processing a material includes providing 802 a plasma generation apparatus 100 configured to process a material through a plasma field 400. The plasma generation apparatus 100 includes a housing element 102 having an outer surface 104 and an inner surface 106 extending cylindrically along a longitudinal axis 108 between a first end 110 and a second end 112. The outer surface 104 is disposed opposite the inner surface 106. The plasma generation apparatus 100 further includes a plasma reaction chamber 120 having an inner circumference 118 defined by the inner surface 106 and configured to generate a plasma field 400.

Multiple electrode rings 126*a*-126*e* may be disposed within the plasma reaction chamber 120. In certain embodiments, one or more of the electrode rings 126*a*-126*e* includes a plurality of electrodes 132. The electrode rings 126*a*-126*e* may be disposed within the plasma reaction chamber 120 to form an arc path 134*a*-134*i* extending along an inside wall 144 of the plasma reaction chamber 120 between the first end 110 and the second end 112.

A power supply 140 is coupled to the outer surface 104 of the housing element 102. The power supply 140 includes multiple primary coils 142 winding about the outer surface 104 in a direction perpendicular to the longitudinal axis 108. A secondary coil 150 winds about the primary coil 142 in a direction perpendicular to the longitudinal axis 108. A coil core 156 is in contact with at least a portion of each of the primary coils 142.

The method 800 includes actuating 804 the power supply 140 to energize the secondary coil 150. In some embodiments, the voltage potential difference between the anode 148*a* and the cathode 148*b* creates energized electrons or arc energy 133 that shoots down the electrodes 132 along one or more arc paths 134*a*-134*i*. In these and other embodiments, the arc energy 133 generates an ionized plasma field 400 within the plasma reaction chamber 120. The method 800 further includes conveying 806 a material through the plasma field 400 for processing.

Figure 9:
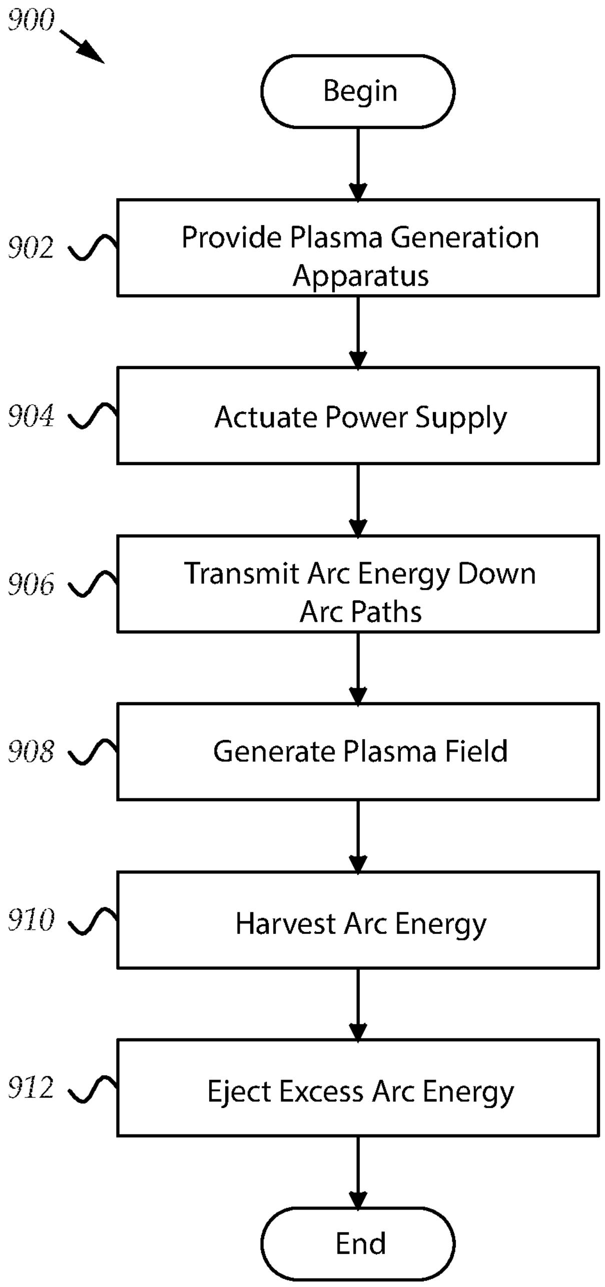
FIG. 9 is a schematic flow chart diagram of another method for processing a material in accordance with various embodiments of the present disclosure.

Referring now to FIG. 9, while also referring to FIGS. 1, 2, and 5B, in some embodiments, a method 900 for processing a material includes providing 902 the plasma generation apparatus 100 and actuating 904 the power supply 140. In some embodiments, providing 902 the plasma generation apparatus 100 includes disposing within the plasma reaction chamber 120 a first electrode ring 126*b* having a first set of catalysts 137 and a second electrode ring 126*c* having a second set of catalysts 138. The first electrode ring 126*b* may be disposed adjacent to the second electrode ring 126*c* to facilitate a chemical reaction between the first set of catalysts 137 and the second set of catalysts 138.

In some embodiments, the method 900 includes transmitting 906 arc energy 133 along the arc path 134*a*-134*i*. In some embodiments, the power supply 140 includes an anode 148*a* disposed near the first end 110 of the plasma reaction chamber 120 and a cathode 148*b* disposed near the second end 112 of the plasma reaction chamber 120. In other embodiments, the anode 148*a* and the cathode 148*b* are reversed such that the anode 148*a* is disposed near the second end 112 of the plasma reaction chamber 120 and the cathode 148*b* is disposed near the first end 110 of the plasma reaction chamber 120. In some embodiments, transmitting 906 the arc energy 133 includes transmitting 906 the arc energy 133 between the anode 148*a* and the cathode 148*b*.

In certain embodiments, the method 900 further includes generating 908 the plasma field 400 within the plasma reaction chamber 120 and harvesting 910 the arc energy 133 via piezoelectric crystals 146, for example. In certain embodiments, the arc path 134*a*-134*i* extends over the piezoelectric crystals 146 to maximize harvesting efficiency. In some embodiments, the method 900 includes ejecting 912 excess arc energy 133 from the plasma reaction chamber 120.

Figure 10:
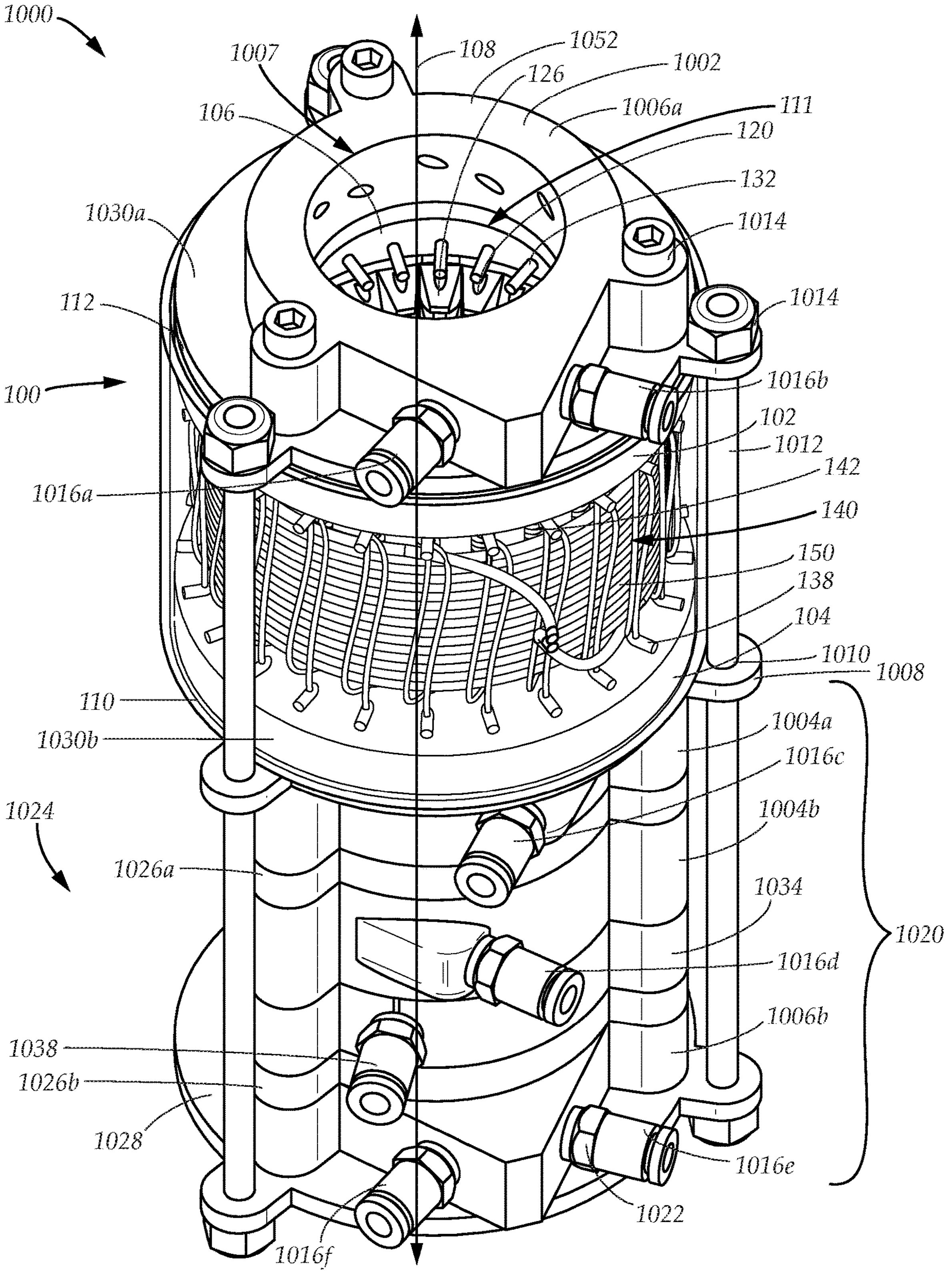
FIG. 10 is a perspective view of a modular plasma generation system including a plasma generation apparatus and multiple other modular processing components for processing one or more materials in accordance with some embodiments of the present disclosure.
Figure 11:
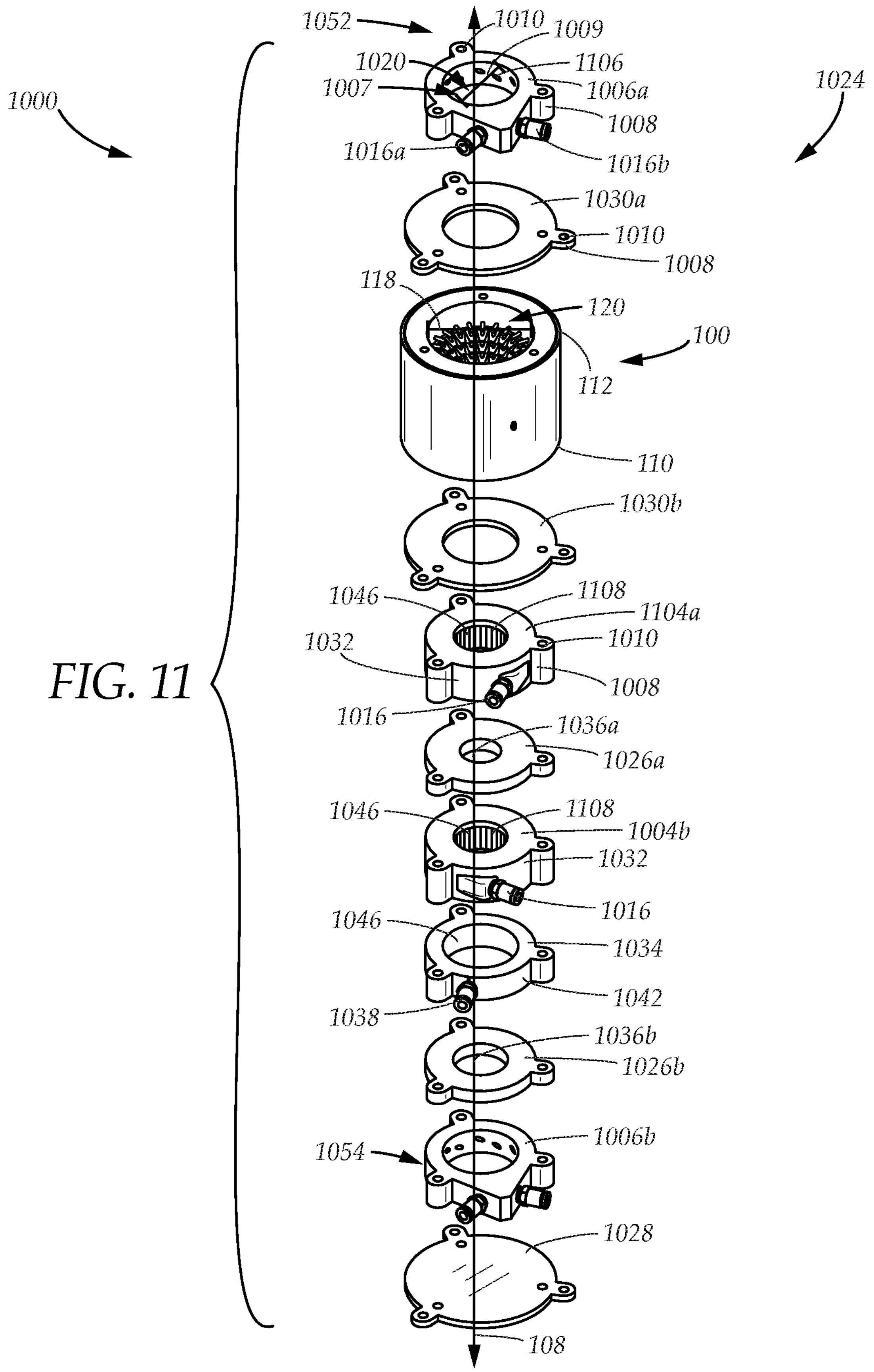
FIG. 11 is an exploded perspective view of the modular plasma generation system of FIG. 10.

Referring now to FIGS. 10 and 11, while also referring to FIGS. 1 and 3, in some embodiments, a plasma generation system 1000 includes another plasma generation apparatus 100 that includes a housing element 102, a plasma reaction chamber 120, a plurality of electrode rings 126*a*-126*e*, and a power supply 140, which are substantially similar to those described above in relation to the plasma generation apparatus 100 of FIG. 1. In some embodiments, the plasma generation system 1000 further includes multiple modular processing components 1024, thereby providing multiple mechanisms for processing materials.

In some embodiments, the plasma generation apparatus 100 and the modular processing components 1024 include at least one mounting hole 1010 configured to receive a rigid connecting rod 1012. In some embodiments, one or more of the modular processing components 1024 includes a mounting projection 1008 extending from its periphery. The mounting hole 1010 may be integrated into the mounting projection 1008. In some embodiments, one or more mounting holes 1010 is disposed in the first end 110 and/or the second end 112 of the plasma generation apparatus 100. In these and other embodiments, the plasma generation apparatus 100 and other modular processing components 1024 may be stacked or otherwise arranged in series along the longitudinal axis 108 such that the mounting projections 1008 and/or mounting holes 1010 of the plasma generation apparatus 100 and each of the other modular processing components 1024 are aligned.

In some embodiments, the connecting rod 1012 may extend through corresponding the mounting holes 1010 of the plasma generation apparatus 100 and each of the other modular processing components 1024 to secure a position of the modular processing components 1024 with respect to each other. In some embodiments, one or more securing elements 1014 is coupled to the connecting rod 1012 to secure a position of the connecting rod 1012 with respect to the mounting holes 1010. Of course, the modular processing components 1024 may be coupled to the plasma generation apparatus 100 and/or other modular processing components 1024 via any suitable mechanical devices and/or techniques including screws, bolts, rivets, grommets, adhesives, welding, bonding, and/or the like.

In some embodiments, the plasma generation apparatus 100 and one or more modular processing components 1024 are interchangeable, replaceable, and/or modifiable to form a plasma generation system 1000 having desired characteristics and capabilities. In some embodiments, the plasma generation system 1000 is modifiable in situ. To this end, in some embodiments, the plasma generation system 1000 includes various combinations of plasma generation apparatuses 100, fixed and variable vortex generator elements 1004, 1006, and/or raw material injection collars 1034 configured to produce electromagnetic fields, chemical reactions, friction, and/or temperatures as needed to create a desired material output. The material output may include, for example, concrete, metal, polymers/monomers, gases, and/or any other desired material output.

In some embodiments, one or more waste products such as coal ash, carbon dioxide, and/or the like, are fed into the plasma generation system 1000 via the plasma generation apparatus 100, fixed direction vortex generator elements 1004, variable direction vortex generator elements 1006, and/or raw material injection collars 1034. As the waste product flows through the plasma generation system 1000, the plasma reaction chamber 120 may be configured to carbonize the material via ionized plasma, heat, and/or catalyst-assisted reactions. In some embodiments, the plasma reaction chamber 120 includes electrodes 132 doped with one or more catalyst materials 136 to facilitate creation of materials used for anode production for lithium batteries, for example. In certain embodiments, opposing vortexes produced by the fixed and/or variable vortex generator elements 1004, 1006 may also be used to create heat and agitation to facilitate the production process.

In certain embodiments, the plasma generation system 1000 includes a plasma generation apparatus 100 similar to the plasma generation apparatus 100 described above with reference to FIG. 1. The plasma generation apparatus 100 may include a housing element 102, a plasma reaction chamber 120, a plurality of electrode rings 126, and a power supply 140. The housing element 102 includes an inner surface 106 extending cylindrically along a longitudinal axis 108 between a first end 110 and a second end 112. An outer surface 104 is disposed opposite the inner surface 106 between the first end 110 and the second end 112.

The plasma reaction chamber 120 is defined by the inner surface 106 and is configured to generate a plasma field (not shown) for processing a material. The plurality of electrode rings 126 is disposed within the plasma reaction chamber 120. Each of the electrode rings 126 includes multiple electrodes 132. At least a portion of the electrodes 132 corresponding to more than one of the electrode rings 126 forms an arc path 134 along a wall 144 of the plasma reaction chamber 120 between the first end 110 and the second end 112.

The power supply 140 is coupled to the outer surface 104. The power supply 140 includes multiple primary coils 142 winding about the outer surface 104 in a direction perpendicular to the longitudinal axis 108. A secondary coil 150 winds about the primary coils 142 in a direction perpendicular to the longitudinal axis 108 and is configured to induce a voltage on the plurality of primary coils 142. A coil core 156 is in contact with at least a portion of each of the primary coils 142.

One or more modular processing components 1024 may be coupled to the first end 110 and/or to the second end 112 of the plasma generation apparatus 100 to form a hollow processing chamber 1020 aligned with the longitudinal axis 108. In some embodiments, the modular processing components 1024 include one or more vortex generator elements 1004*a*, 1004*b*, 1006*a*, 1006*b*, one or more orifice plate elements 1026*a*, 1026*b*, and/or one or more raw material injection collars 1034. The vortex generator elements 1004*a*, 1004*b*, 1006*a*, 1006*b* may include one or more variable direction vortex generator elements 1006*a*, 1006*b* and/or one or more fixed direction vortex generator elements 1004*a*, 1004*b*.

The variable direction vortex generator elements 1006*a*, 1006*b* and/or the fixed direction vortex generator elements 1004*a*, 1004*b* may be configured to generate a material vortex. The variable direction vortex generator elements 1006*a*, 1006*b* and/or the fixed direction vortex generator elements 1004_a_, 1004_b_ may include an O-ring or substantially cylindrical shape having a central orifice 1007 configured to substantially align with and/or correspond to a cross-sectional shape and/or dimensions of the plasma reaction chamber 120.

In some embodiments, the size or dimensions of the central orifice 1007 may vary as needed to create a material vortex having a desired diameter and/or shape. In some embodiments, the central orifice 1007 of one variable direction vortex generator element 1006_a_, 1006_b_ and/or fixed direction vortex generator element 1004_a_, 1004_b_ varies with respect to the central orifice 1007 of another variable direction vortex generator element 1006_a_, 1006_b_ and/or fixed direction vortex generator element 1004_a_, 1004_b_ of the hollow processing chamber 1020. In this manner, a subsequent material vortex may be configured to substantially encapsulate a previous material vortex, thereby providing a lubrication layer between the hollow processing chamber 1020 and the material being processed.

In one embodiment, the plasma generation system 1000 includes a variable direction vortex generator element 1006_a_ coupled to the second end 112 of the plasma generation apparatus 100 to define an end 1052 or exit of the plasma generation system 1000. In some embodiments, the exit variable direction vortex generator element 1006_a_ is used to shape a resultant material spray pattern, utilizing varying gas pressures, rate of flow, and process gases. The variable direction vortex generator element 1006_a_, 1006_b_ may include a central orifice 1007 through which the material exits the plasma generation system 1000. In some embodiments, one or more securing elements 1014 extend through a top surface 1002 of the variable direction vortex generator element 1006_a_ to secure the variable direction vortex generator element 1006_a_ to the plasma generation apparatus 100.

In some embodiments, one or more suitable materials may be introduced into the plasma generation system 1000 via an opposite end 1054 of the hollow processing chamber 1020. In some embodiments, the process material is introduced into the plasma generation system 1000 via a variable direction vortex generator element 1006_a_, 1006_b_. In some embodiments, the variable direction vortex generator element 1006_a_, 1006_b_ is configured to process one or more suitable materials to form a material vortex. The material may include any suitable liquid, solid, gas, aggregate, and/or combination thereof. In some embodiments, the variable direction vortex generator element 1006_a_, 1006_b_ includes more than one material inlet 1016_a_, 1016_b_ configured to convey the material into an interior vortex formation element 1108 for processing, as discussed in more detail with reference to FIGS. 14A-C below.

In some embodiments, the variable direction vortex generator element 1006_a_, 1006_b_ includes a central orifice 1007 through which the material exits the variable direction vortex generator element 1006_a_, 1006_b_ and is introduced into one or more other modular processing components 1024 forming a hollow processing chamber 1020. In some embodiments, the central orifice 1007 includes a shape and/or dimensions configured to form a material vortex having a desired shape, size, and/or other characteristics. In some embodiments, the central orifice 1007 substantially aligns with the plasma reaction chamber 120 along the longitudinal axis 108. In certain embodiments, the central orifice 1007 includes a diameter 1009 less than or equal to the inner diameter 118 of the plasma reaction chamber 120.

In certain embodiments, an orifice plate element 1026_a_, 1026_b_ may be coupled to the variable direction vortex generator element 1006_a_, 1006_b_ and configured to receive the material vortex formed by the variable direction vortex generator element 1006_a_, 1006_b_. In some embodiments, an orifice plate element 1026_a_, 1026_b_ includes an O-ring or substantially cylindrical shape having one or more central orifices 1036_a_, 1036_b_. The central orifices 1036_a_, 1036_b_ may include a size and/or shape to further shape a material vortex as desired. In some embodiments, the central orifices 1036_a_, 1036_b_ may include dimensions reduced or enlarged relative to the central orifice 1007 of the variable direction vortex generator element 1006_a_, 1006_b_. In some embodiments, the central orifices 1036_a_, 1036_b_ include dimensions corresponding to dimensions of the central orifice 1007 of the variable direction vortex generator element 1006_a_, 1006_b_.

In some embodiments, a raw material injection collar 1034 is disposed between the orifice plate element 1026_b_ and a fixed direction vortex generator element 1004_b_. In some embodiments, the raw material injection collar 1034 is configured to feed one or more suitable materials into the hollow processing chamber 1020, including gases, binders, minerals, and/or the like. In one embodiment, the raw material injection collar 1034 is configured to feed carbon dioxide into the hollow processing chamber 1020. In other embodiments, the raw material injection collar 1034 is configured to feed solid pellets into the hollow processing chamber 1020.

In some embodiments, one or more fixed direction vortex generator elements 1004_a_, 1004_b_ is coupled to the raw material injection collar 1034. In some embodiments, the fixed direction vortex generator element 1004_a_, 1004_b_ is configured to form a material vortex for introduction into the first end 110 of the plasma reaction chamber 120. In one embodiment, an orifice plate element 1026_a_, 1026_b_ is disposed between adjacent fixed direction vortex generator elements 1004_a_, 1004_b_.

In certain embodiments, a plasma core support plate and spark arrestor 1030_a_, 1030_b_ is disposed between the first end 110 of the plasma reaction chamber 120 and the fixed direction vortex generator element 1004_a_. In some embodiments, a plasma core support plate and spark arrestor 1030_a_, 1030_b_ may also be disposed between the second end 112 of the plasma reaction chamber 120 and a variable direction vortex generator element 1006_a_. The plasma core support plate and spark arrestor 1030_a_, 1030_b_ may have a shape and/or dimensions substantially conforming to the shape and/or dimensions of the first and/or second ends 110, 112 of the plasma reaction chamber 120. In some embodiments, the plasma core support plate and spark arrestor 1030_a_, 1030_b_ includes dimensions substantially conforming to the dimensions of the variable direction vortex generator element 1006_a_ or the fixed direction vortex generator element 1004_a_. In some embodiments, the plasma core support plate and spark arrestor 1030_a_, 1030_b_ is configured to distribute heat and/or reduce a temperature of the plasma generation apparatus 100.

In some embodiments, the modular processing components 1024 include a mounting plate 1028 coupled to an end 1054 of the hollow processing chamber 1020. The mounting plate 1028 may be configured to mount the plasma generation system 1000 to a robotic arm or other suitable structure. For example, in some embodiments, the plasma generation system 1000 is mounted to the end of a positioning arm and configured to spray a pattern of resultant material onto a substrate to create a solidified structure having a desired shape or pattern. In other embodiments, the plasma generation system 1000 is maintained in a stationary position for processing resultant material into a collection bin or hopper.

In one embodiment, the plasma generation system 1000 is configured to produce synthetic aggregate materials. In some embodiments, raw aggregate materials such as carbon dioxide and/or other suitable materials are fed into the raw material injection collar 1034 via a material port 1038. In some embodiments, these materials are formed into an inner material vortex shaped via an orifice plate element 1026*b*.

In certain embodiments, the plasma generation system 1000 utilizes a "tornado inside of a tornado" mechanism such that an outer material vortex layer acts as a lubrication layer between a process material such as carbon dioxide and the plasma reaction chamber 120 and/or hollow processing chamber 1020. In some embodiments, larger gases such as argon and/or other suitable gases or materials may be used to create the outer material vortex layer.

In one embodiment, as the carbon dioxide flows through the plasma reaction chamber 120, it is broken down into carbon monoxide. Binders and minerals may be injected into the process material to create new and novel aggregates. The modularity of the plasma generation system 1000 design may allow for multiple vortex generator elements 1006*a*, 1006*b*, 1004*a*, 1004*b* and raw material injection collars 1034 to be utilized to process materials. In some embodiments, the plasma reaction chamber 120 may utilize electrodes 132 doped with catalyst materials 136 to further facilitate the creation of synthetic aggregates and/or other desired materials. In certain embodiments, the plasma reaction chamber 120 may be flooded with a solvent to alter the properties of a final output material.

One or more process materials may also be introduced via various vortex generator elements 1006*a*, 1006*b*, 1004*a*, 1004*b* or raw material injection collars 1034. Process gases, aggregates, doped electrodes 132, other suitable materials, and/or the ionized plasma field 400 may be used to facilitate desired chemical reactions and material output. In some embodiments, the variable direction vortex generator element 1006*a*, 1006*b* may be bi-directional, allowing adjustment of the spray pattern at the end 1052 of the plasma generation system 1000 and facilitate precise control of the material vortex at the opposite end 1054 of the plasma generation system 1000.

Figure 12:
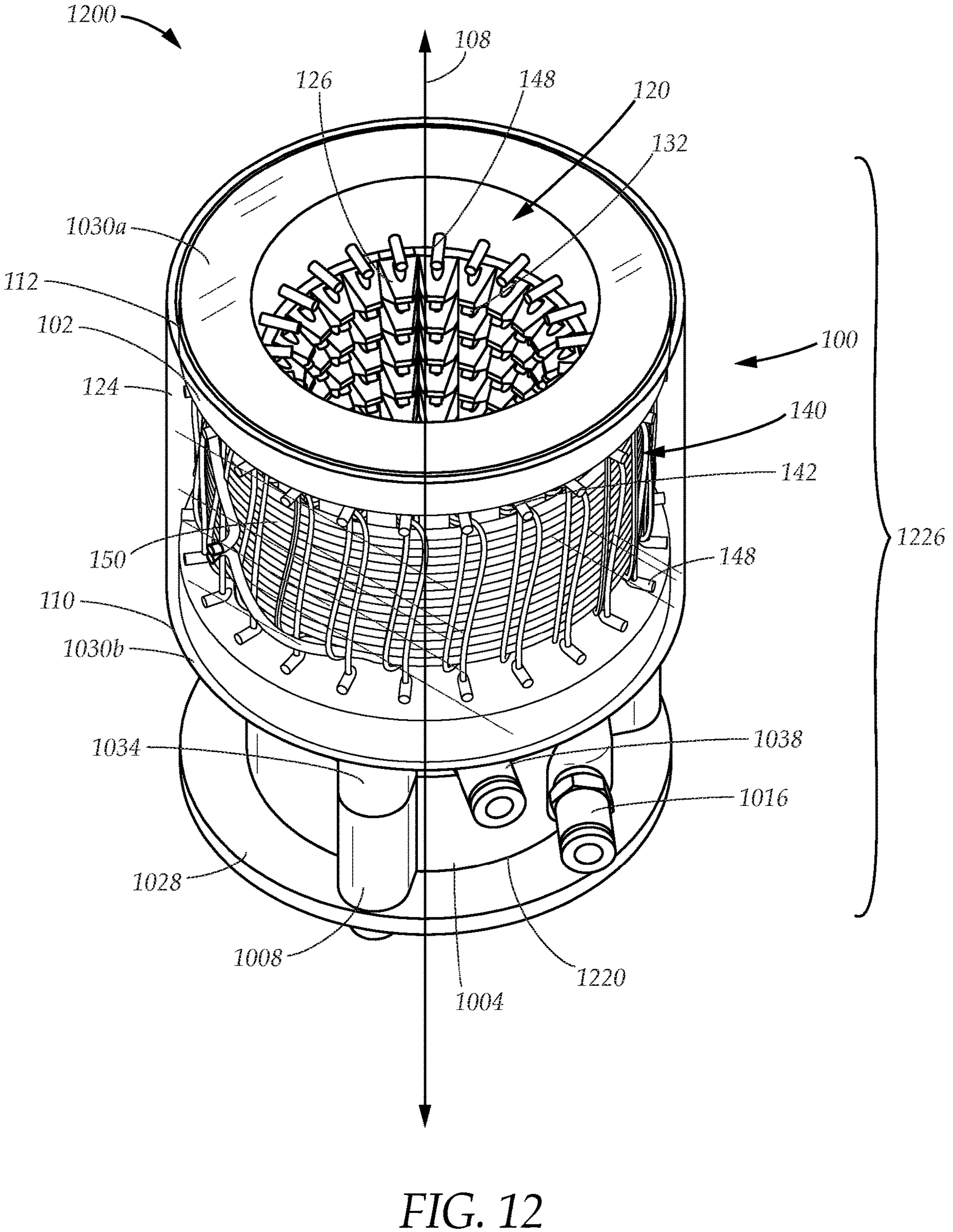
FIG. 12 is a perspective view of a plasma generation system for processing carbon to generate a carbon nanotube in accordance with certain embodiments.
Figure 13:
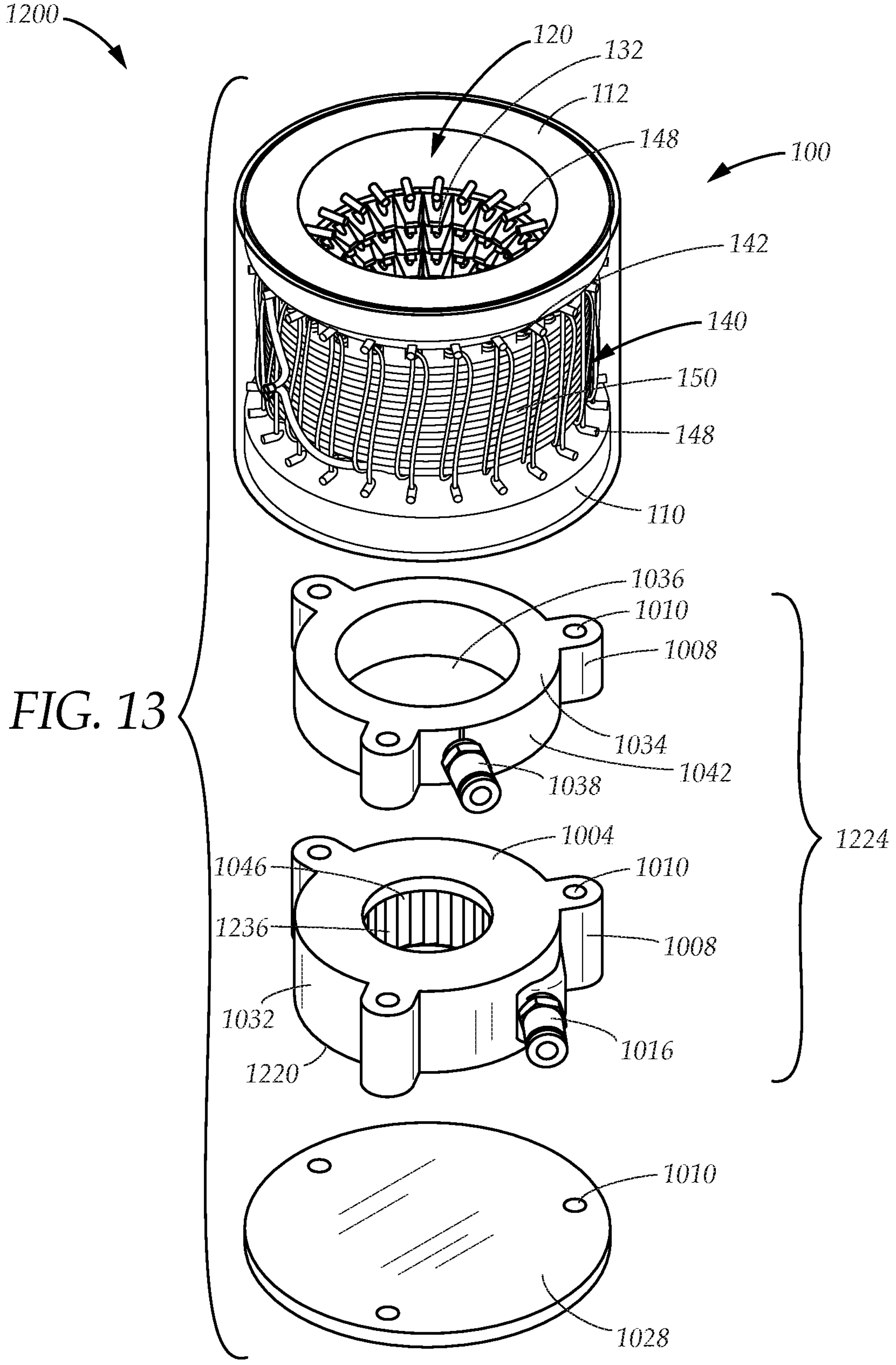
FIG. 13 is an exploded perspective view of the plasma generation system of FIG. 12.

Referring now to FIGS. 12 and 13, while also referring to FIGS. 1, 3, and 4, in some embodiments, a plasma generation system 1200 is configured to generate superconductors such as carbon nanotubes and/or other structural tubes and/or fibers from carbon dioxide, coal ash, graphite, or other raw materials. In some embodiments, the plasma generation system 1200 includes another plasma generation apparatus 100 that is substantially similar to the plasma generation apparatus 100 of FIG. 1. The plasma generation apparatus 100 may include a housing element 102, a plasma reaction chamber 120, a plurality of electrode rings 126*a*-126*e*, and a power supply 140. In some embodiments, the plasma generation system 1200 further includes multiple modular processing components 1224, which are substantially similar to those described above in relation to the plasma generation system 1000 of FIG. 10.

In some embodiments, the plasma generation system 1200 is configured to process one or more process materials to generate a material vortex (not shown) upstream of the plasma generation apparatus 100. In these and other embodiments, the process material is introduced to the plasma generation system 1200 at one end 1220 of a hollow processing chamber 1226. The hollow processing chamber 1020 may include the plasma generation apparatus 100 and multiple modular processing components 1024 arranged in series along a longitudinal axis 108. In some embodiments, the plasma generation system 1200 includes a secondary stage of modular processing components 1024 disposed downstream of the plasma generation apparatus 100.

In some embodiments, a mounting plate 1028 defines an end 1220 of the hollow processing chamber 1226. In some embodiments, the mounting plate 1028 is configured to mount the plasma generation system 1200 to a robotic arm or other suitable structure.

In other embodiments, the plasma generation system 1200 is configured to generate carbon tube structures from carbon lattice sheets. In some embodiments, a fixed direction vortex generator element 1004 is coupled to the mounting plate 1028. A raw material injection collar 1034 may be coupled adjacent to the fixed direction vortex generator element 1004. The raw material injection collar 1034 and the fixed direction vortex generator element 1004 may generate carbon lattice structures by feeding graphite and/or other suitable materials into the plasma generation apparatus 100 to create a lattice of carbon atoms via arc diffusion or the like.

In some embodiments, the material vortex generated by the fixed direction vortex generator element 1004 is used to control the roll of the lattice into a tubular shape. In some embodiments, the intensity and direction of the material vortex may be varied to vary the roll of the lattice. In some embodiments, the lattice sheet is rolled into a tubular formation either within the plasma generation apparatus 100 or in portions of the hollow processing chamber 1020 downstream of the plasma generation apparatus 100. The lattice rolls may include one layer or many layers. In this manner, the plasma generation system 1200 may be configured to create substantially cylindrical carbon structures or nanotubes that may be used in electricity transmission and structural components.

In some embodiments, the hollow processing chamber 1226 may include one or more secondary stage raw material injection collars 1034 and/or fixed or variable direction vortex generator elements 1004 coupled to the second end 112 of the plasma generation apparatus 100. In some embodiments, one or more raw material injection collars 1034 and/or fixed or variable direction vortex generator elements 1004, 1006 may be configured to create a resin, polymer, and/or slurry medium into which the tube structures may be embedded.

In certain embodiments, one or more variable direction vortex generator elements 1006*a*, 1006*b* and/or fixed direction vortex generator elements 1004*a*, 1004*b* may be used as a stand-alone sorting system and/or material refining device. In this case, the resulting material vortex may force the heavier aggregate materials to the outside of the vortex and the lighter aggregate materials to the middle of the vortex. In some embodiments, the one or more variable direction vortex generator elements 1006*a*, 1006*b* and/or fixed direction vortex generator elements 1004*a*, 1004*b* thus provide a sorting method to produce rings of sorted materials.

Figure 14A:
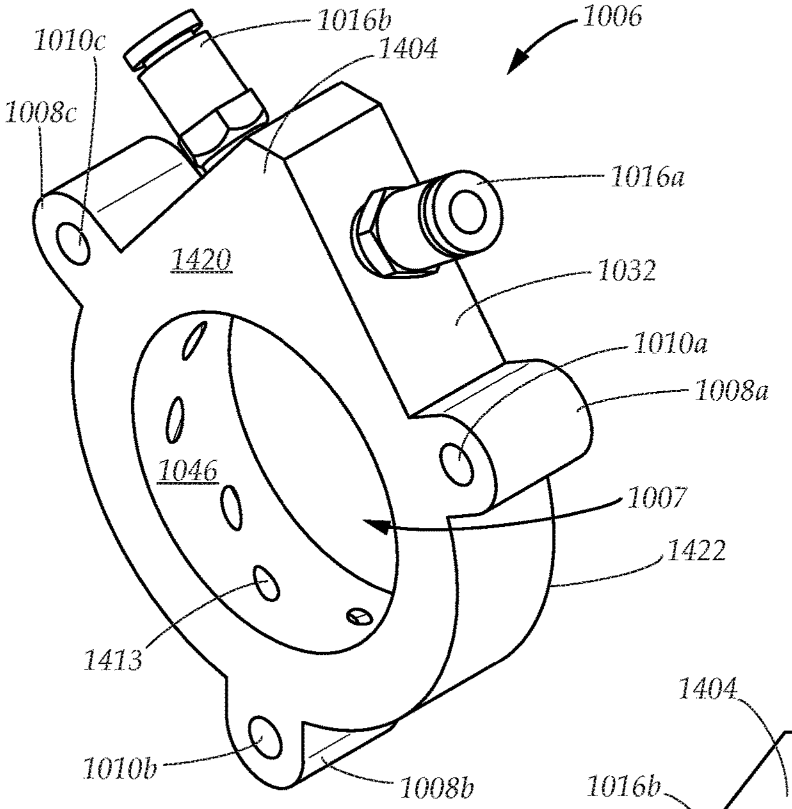
FIG. 14A is a perspective view of a variable vortex generator element configured to generate a material vortex in accordance with various embodiments of the present disclosure.
Figure 14B:
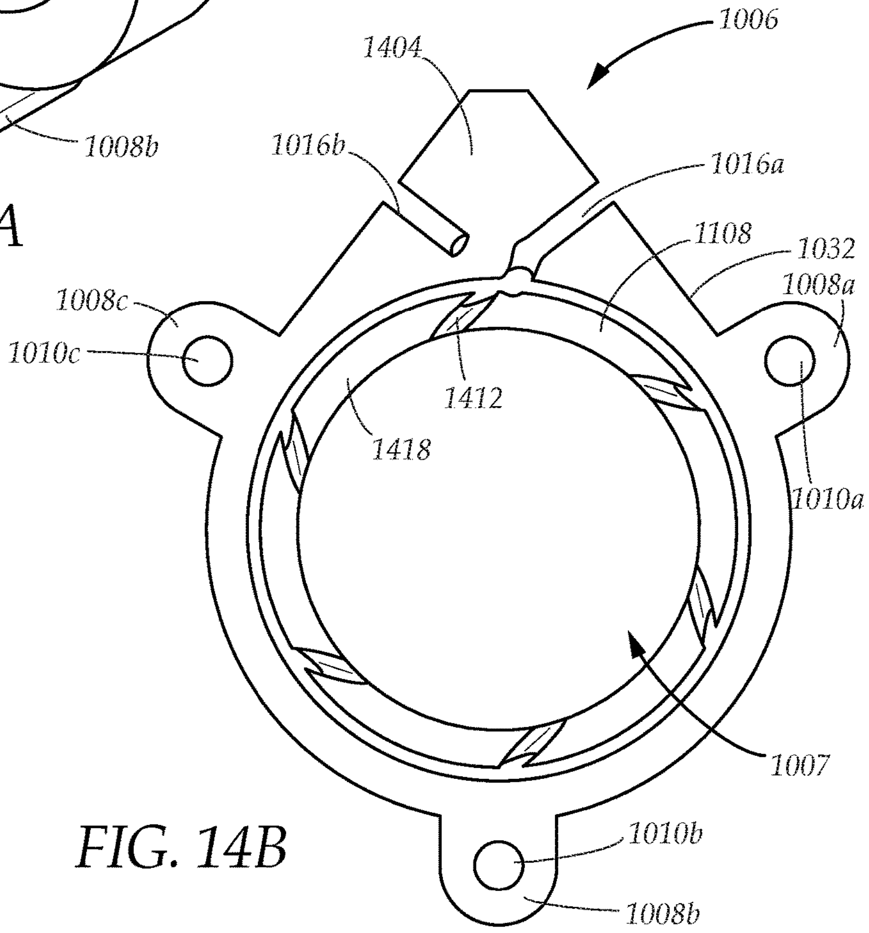
FIG. 14B is a cross-sectional view of the variable vortex generator element of FIG. 14A illustrating an interior vortex formation element defining multiple exit pathways in accordance with certain embodiments of the disclosure.
Figure 14C:
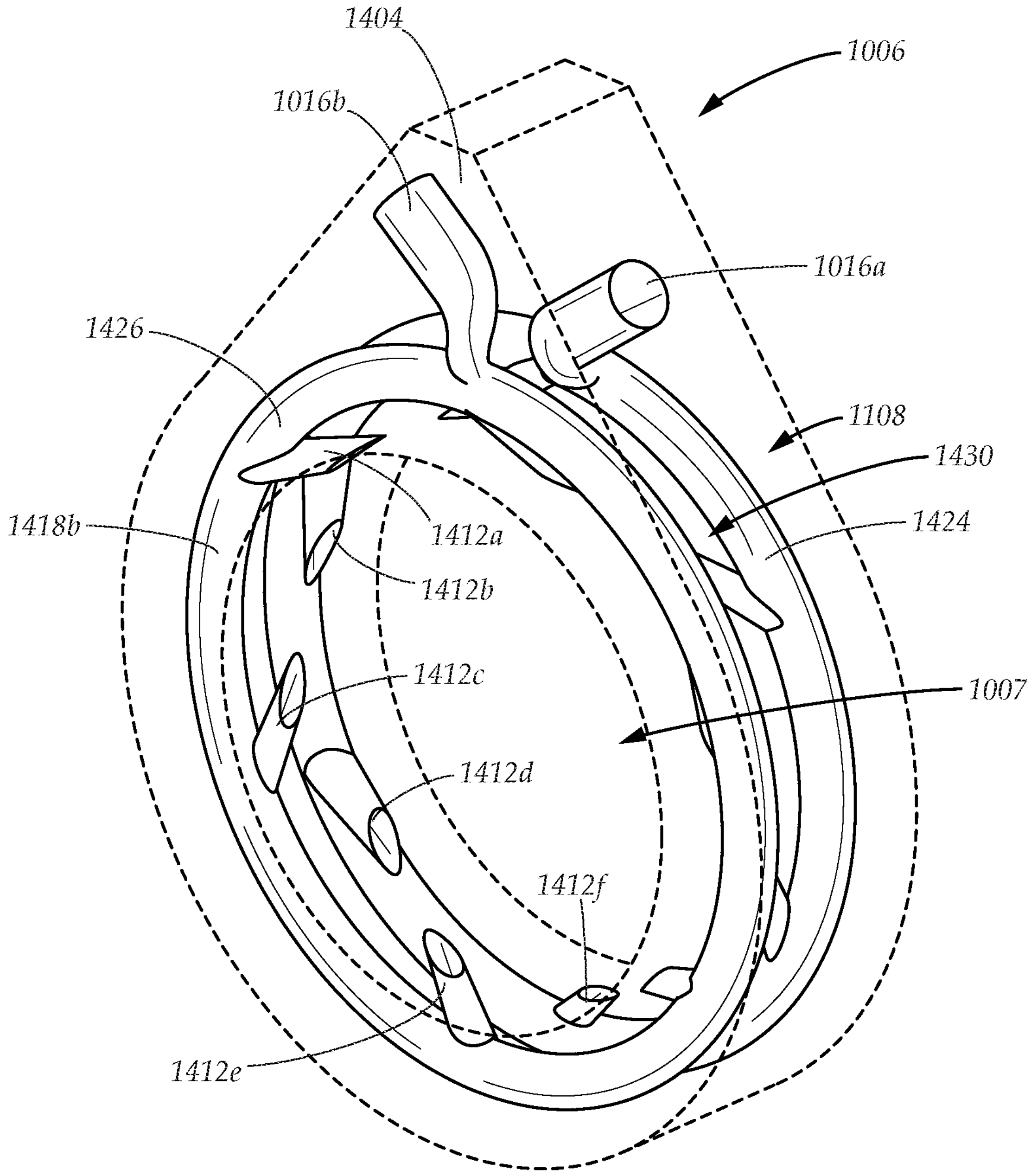
FIG. 14C is a side perspective view of the interior vortex formation element of FIG. 14B illustrating a double tube structure in accordance with some embodiments.

Referring now to FIGS. 14A, 14B, and 14C, while also referring to FIGS. 10 and 11, in some embodiments, the variable direction vortex generator element 1006 includes an interior vortex formation element 1108 configured to process one or more materials to generate a material vortex. In certain embodiments, the material vortex is generated within a portion of the variable direction vortex generator element 1006 forming the hollow processing chamber 1020. In certain embodiments, the variable direction vortex generator element 1006 includes an exterior surface 1032, an interior surface 1046, and an interior vortex formation element 1108.

In some embodiments, the variable direction vortex generator element 1006 forms an O-ring shape such that the interior surface 1046 is substantially inscribed within an exterior edge 1402. The interior surface 1046 and the exterior edge 1402 may extend substantially transversely between a substantially planar first side surface 1420 and a substantially planar second side surface 1422. In some embodiments, the variable direction vortex generator element 1006 includes a substantially triangular extension portion 1404.

In some embodiments, the first side surface 1420 and/or the second side surface 1422 may be configured to be disposed adjacent to another modular processing component 1024 such that the variable direction vortex generator element 1006*a*, 1006*b* and the adjacent modular processing components 1024 lie substantially flush with one another. The interior surface 1046 may form a central orifice 1007 disposed between the first side surface 1420 and the second side surface 1422. In some embodiments, the central orifice 1007 forms at least a portion of the hollow processing chamber 1020.

In some embodiments, the interior vortex formation element 1108 is disposed within the variable direction vortex generator element 1006*a*, 1006*b* such that the exterior surface 1032 substantially surrounds the interior vortex formation element 1108. In some embodiments, the interior vortex formation element 1108 includes a tube structure 1418 formed into a circular or other suitable shape such that the interior vortex formation element 1108 substantially circumscribes the central orifice 1007.

Referring now to FIG. 14C, while still referring to FIGS. 14A and 14B, in some embodiments, the interior vortex formation element 1108 includes a double tube structure 1430 including two tubing elements 1418. In these and other embodiments, two material inlets 1016*a*, 1016*b* may be disposed in the exterior surface 1032. The material inlets 1016*a*, 1016*b* may be configured to introduce at least one process material into the interior vortex formation element 1108 to form a material vortex within the central orifice 1007 and/or hollow processing chamber 1020.

In some embodiments, the double tube structure 1430 includes a first tube structure 1424 in fluid communication with a first material inlet 1016*a* and a second tube structure 1426 in fluid communication with a second material inlet 1016*b*. In certain embodiments, the first material inlet 1016*a* and the second material inlet 1016*b* are disposed in opposing side surfaces 1428 of the triangular extension portion 1404.

In some embodiments, the material inlets 1016*a*, 1016*b* form a fluid pathway extending from the exterior surface 1032 to the interior vortex formation element 1108. The material inlets 1016*a*, 1016*b* may be configured to communicate one or more process materials to the interior vortex formation element 1108. In some embodiments, the material inlets 1016*a*, 1016*b* extend in opposing directions relative to each other, in directions substantially parallel to corresponding sides of the triangular extension portion 1404.

In some embodiments, the interior vortex formation element 1108 includes a plurality of exit pathways 1412*a-f* extending to apertures 1413 formed in the interior surface 1046 forming the central orifice 1007. In some embodiments, each of the exit pathways 1412 extend away from its respective tubing element 1418 at an angle. In some embodiments, each of the exit pathways 1412 extends in a direction substantially parallel to each other exit pathway 1412 disposed on the same tubing element 1418. In some embodiments, exit pathways 1412 corresponding to each of the first tube structure 1424 and the second tube structure 1426 extend at opposite angles relative to each other. For example, in one embodiment, the exit pathways 1412 of the first tube structure 1424 extend in a clockwise direction and the exit pathways 1412 of the second tube structure 1426 extend in a counterclockwise direction such that corresponding exit pathways 1412 of both the first tube structure 1424 and the second tube structure 1426 form a substantially criss-cross pattern relative to each other.

In these and other embodiments, the interior vortex formation element 1108 includes the first tube structure 1424 oriented in a first orientation and configured to generate a first material vortex layer (not shown), and the second tube structure 1426 may be oriented in a second orientation and configured to generate a second material vortex layer (not shown). This may provide a volatile interface layer between the vortexes in which the innermost material vortex layer will fold over on itself, creating friction and heat. In some embodiments, the first material vortex layer and the second material vortex layer are disposed in opposite directions to form a volatile interface layer. In some embodiments, the volatile interface layer is configured to refine aggregate material into smaller pieces.

Figure 15A:
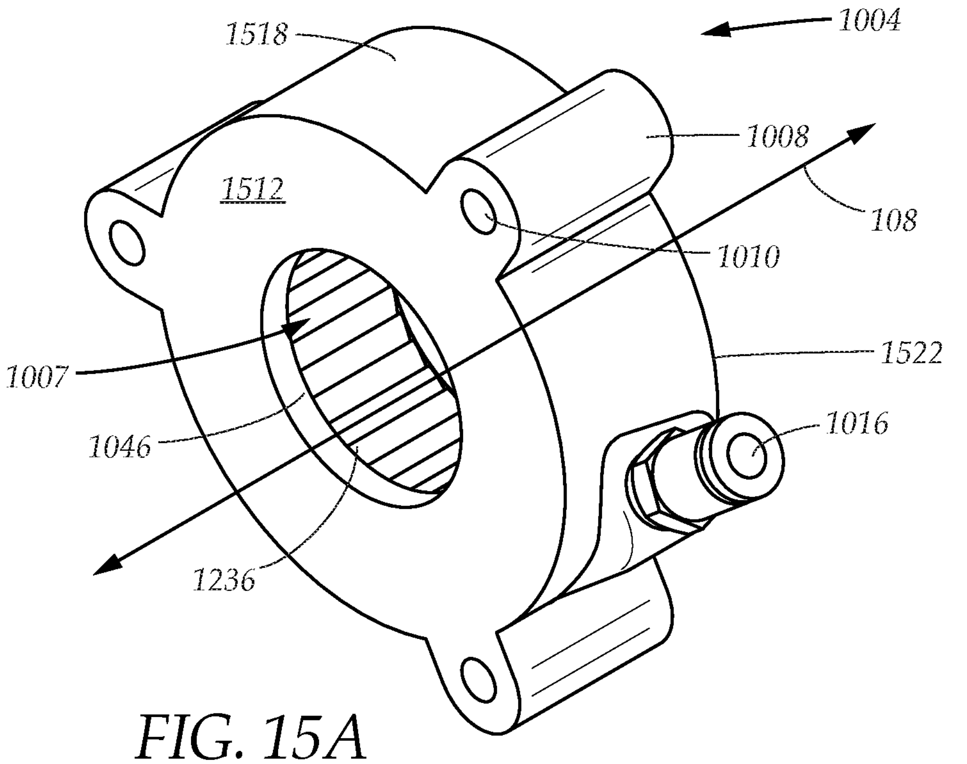
FIG. 15A is a perspective view of a fixed vortex generator element in accordance with various embodiments of the present disclosure.
Figure 15B:
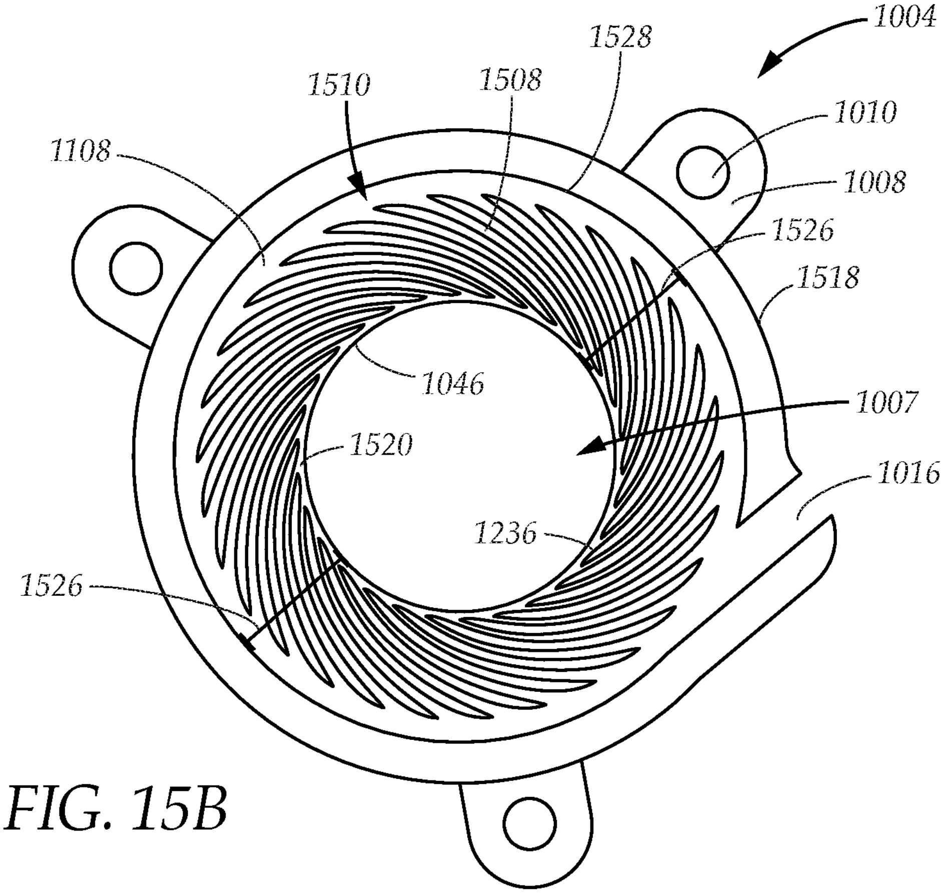
FIG. 15B is a cross-sectional top view of the fixed generator element of FIG. 15A illustrating the interior vortex formation element including a plurality of plates defining a whorl formation in accordance with some embodiments of the present disclosure.

Referring now to FIGS. 15A and 15B, in some embodiments, a fixed direction vortex generator element 1004 includes an interior vortex formation element 1108 configured to process one or more materials to generate a material vortex. The fixed direction vortex generator element 1004 may include a first planar side surface 1512 and a second planar side surface 1522. In some embodiments, an exterior edge 1518 extends substantially transversely between the first planar side surface 1512 and the second planar side surface 1522. Similarly, in some embodiments, the interior surface 1046 extends substantially transversely between the first planar side surface 1512 and the second planar side surface 1522 such that the interior surface 1046 is substantially parallel to the exterior edge 1518.

In some embodiments, the fixed direction vortex generator element 1004 forms an O-ring shape such that the interior surface 1046 is substantially inscribed within the exterior edge 1518.

In some embodiments, the first planar side surface 1512 and/or the second planar side surface 1524 may be disposed adjacent to another modular processing component 1024 such that the fixed direction vortex generator element 1004*a*, 1004*b* and the adjacent modular processing components 1024 lie substantially flush with one another. In some embodiments, the interior surface 1046 forms a central orifice 1007 disposed between the first planar side surface 1512 and the second planar side surface 1524. In some embodiments, the central orifice 1007 forms at least a portion of the hollow processing chamber 1020.

In some embodiments, the fixed direction vortex generator element 1004 includes an interior vortex formation element 1108 having multiple plates 1508 disposed in series and extending substantially transversely between the first side surface 1522 and the second side surface 1524. In some embodiments, each of the plates 1508 is substantially planar. In other embodiments, each of the plates 1508 is substantially arched or curved. In some embodiments, the plates 1508 are disposed to define an arched or whorl formation 1510. The whorl formation 1510 may have a width 1526 defined by the central orifice 1007 at one end and an inner wall 1528 disposed opposite the edge 1518 at the other end. In some embodiments, the whorl formation 1510 occupies more than half of the width 15266 of the fixed direction vortex generator element 1004*a*, 1004*b* measured from the central orifice 1007 to the edge 1518.

In some embodiments, an edge 1236 of each of the plates 1508 defines the interior surface 1046 and/or the central orifice 1007. In some embodiments, adjacent edges 1236 may be substantially evenly spaced and separated by a channel 1520 in fluid communication with the central orifice 1007, forming an interior surface 1046 having at least a portion that is substantially fluted.

The fixed direction vortex generator element 1004 may include a material inlet 1016 configured to receive a material for processing and to direct the material into the interior vortex formation element 1108. In some embodiments, the interior vortex formation element 1108 is configured to rotate upon receiving the material into one or more of the channels 1520. In operation, in some embodiments, the interior vortex formation element 1108 forces the material to traverse the channels 1520 in a direction from the material inlet 1016 to the central orifice 1007 as the interior vortex formation element 1108 spins. The material forms a material vortex upon exiting the channel 1520 into the central orifice 1007 and/or hollow processing chamber 1020.

Figure 16A:
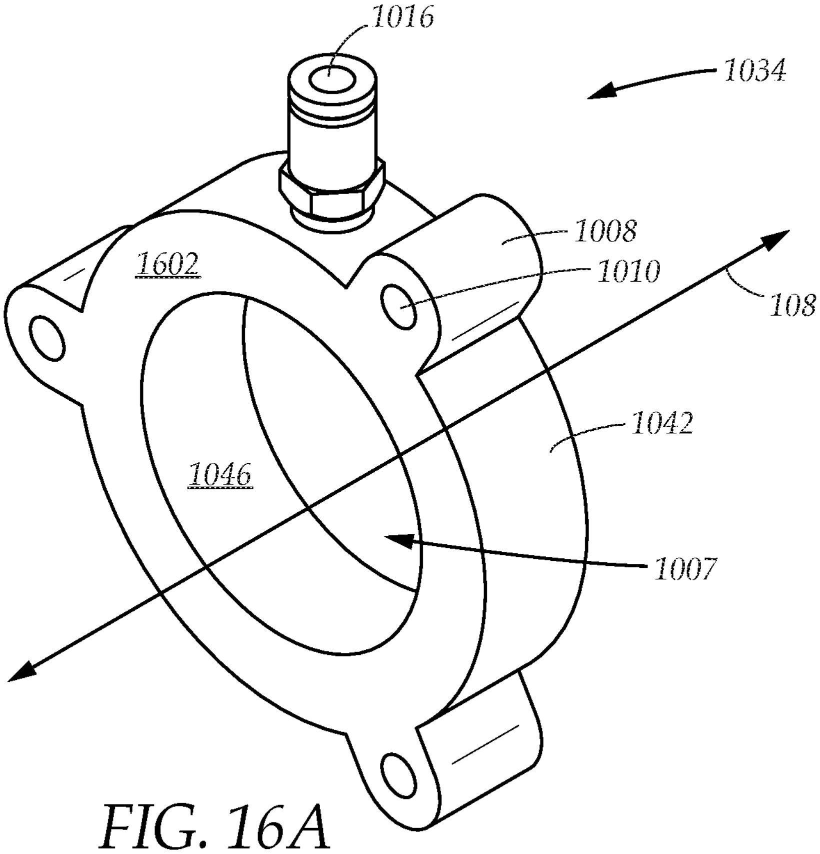
FIG. 16A is a perspective view of an injection collar element configured to inject a process material into the hollow processing chamber in accordance with various embodiments of the present disclosure.
Figure 16B:
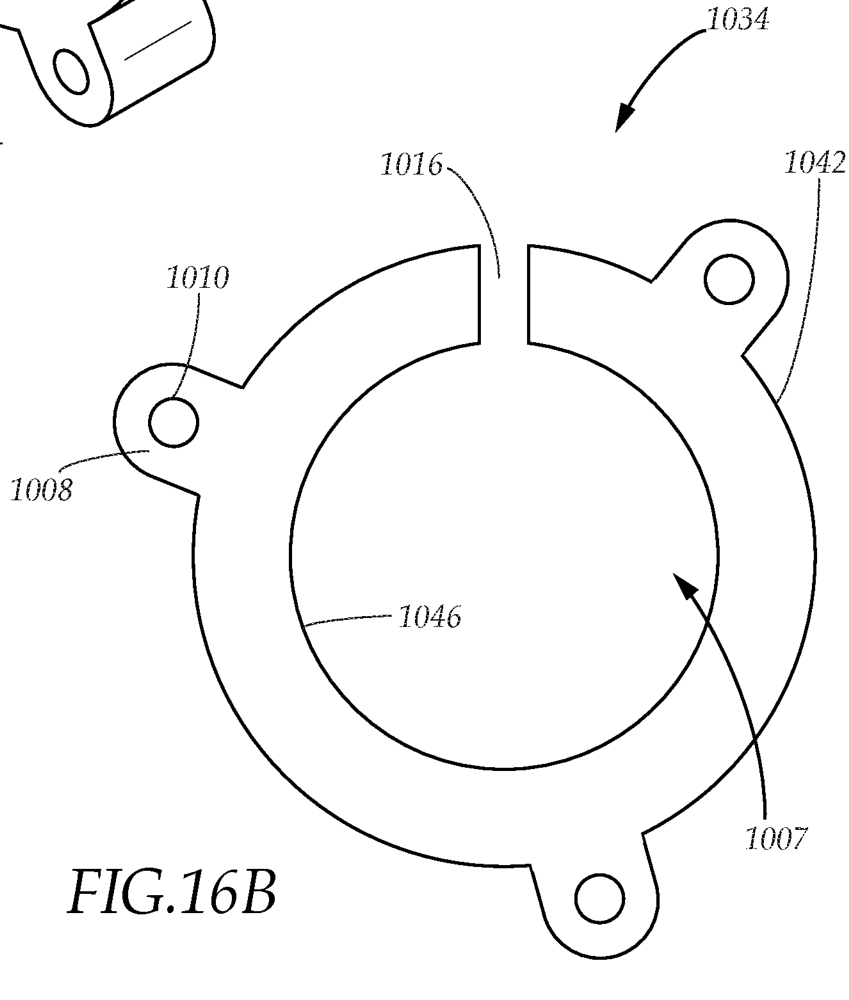
FIG. 16B is a cross-sectional top view of the injection collar element of FIG. 16A showing the material inlet in accordance with some embodiments of the present disclosure.

Referring now to FIGS. 16A and 16B, in some embodiments, a raw material injection collar 1034 includes a substantially planar first side surface 1602 and a substantially planar second side surface 1603, where the first side surface 1602 and the side surface 1428 are substantially transverse to the longitudinal axis 108. In some embodiments, the first side surface 1602 and/or the second side surface 1603 may be configured to be disposed adjacent to another modular processing component 1024 such that the raw material injection collar 1034 and the adjacent one or more modular processing components 1024 lie substantially flush with one another.

In some embodiments, the raw material injection collar 1034 forms an O-ring shape such that the interior surface 1046 is substantially inscribed within an exterior edge 1042. The interior surface 1046 and the exterior edge 1042 may extend substantially transversely between the first side surface 1602 and the second side surface 1603. In some embodiments, the interior surface 1046 forms a central orifice 1007 disposed between the first side surface 1602 and the second side surface 1603. In some embodiments, the central orifice 1007 forms at least a portion of the hollow processing chamber 1020.

In some embodiments, a material port 1038 is disposed in the exterior edge 1042 and configured to direct a material into the central orifice 1007 and/or hollow processing chamber 1020 for further processing.

Figure 17:
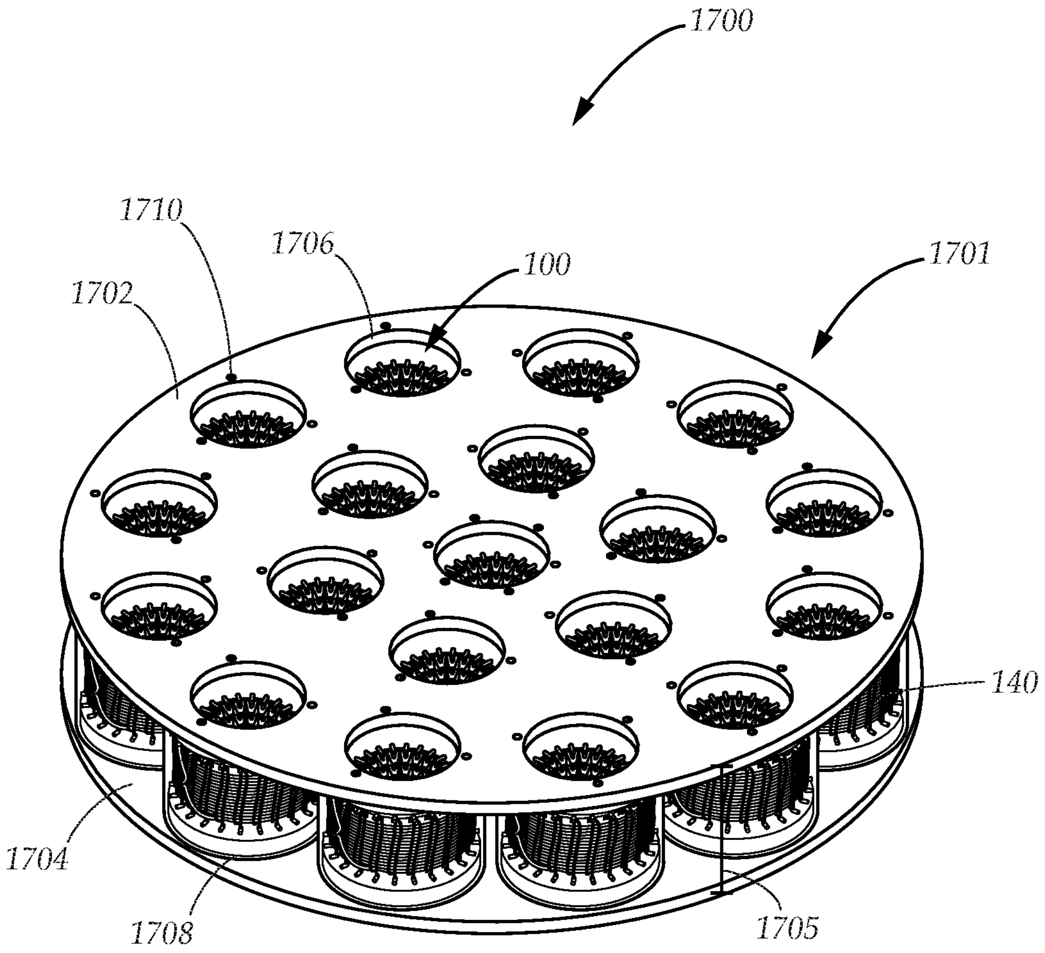
FIG. 17 is a perspective view of a gas neutralization assembly illustrating a housing incorporating multiple plasma generation apparatuses in accordance with certain embodiments of the present disclosure.
Figure 18:
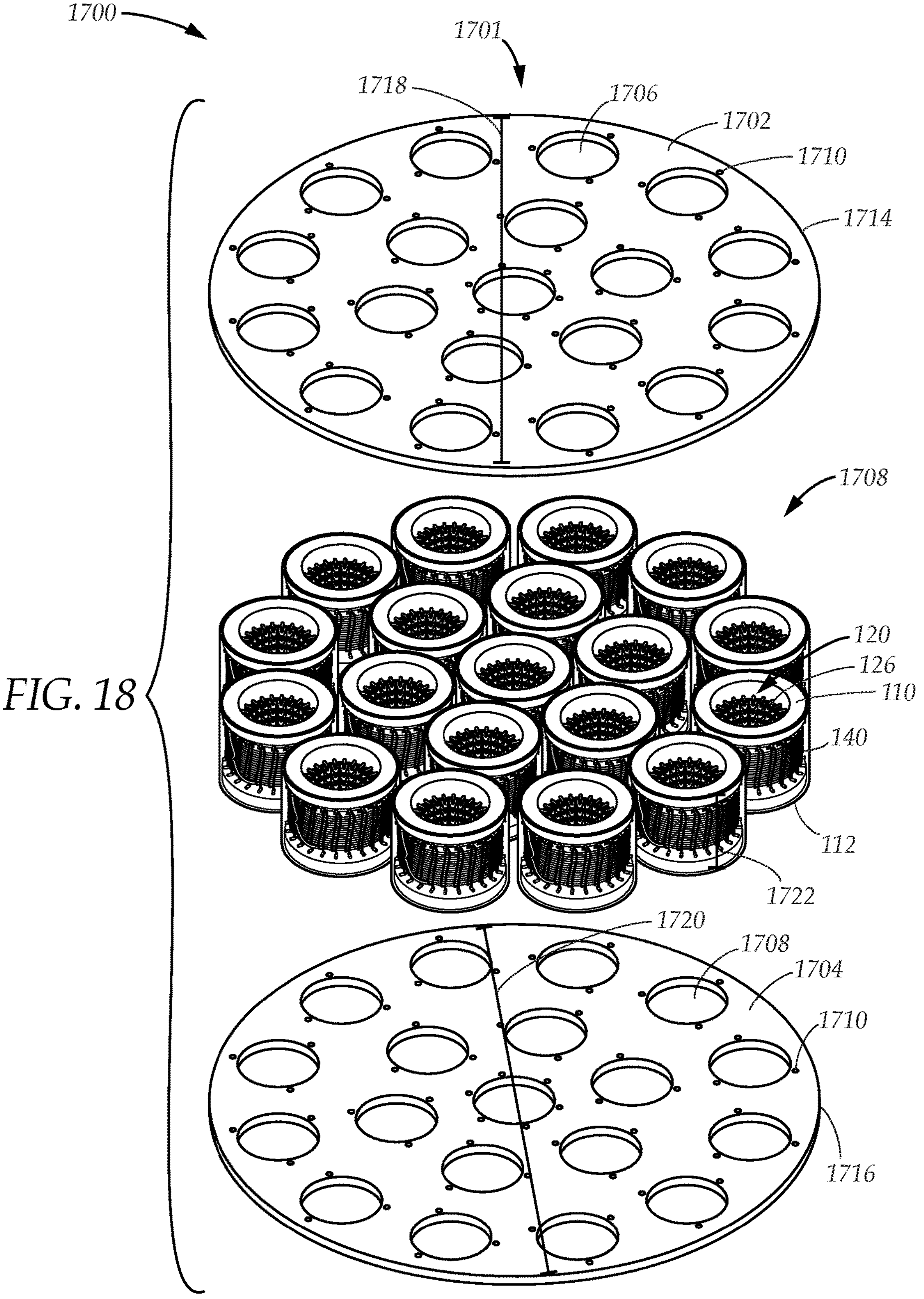
FIG. 18 is an exploded perspective view of the gas neutralization assembly of FIG. 17 showing the top plate, the bottom plate, and openings disposed therethough for retaining the plasma generation apparatuses.

Referring now to FIGS. 17 and 18, while also referring to FIG. 1, in some embodiments, a gas neutralization assembly 1700 includes a housing 1701 including a top plate 1702 and a bottom plate 1704. The housing 1701 may be configured to retain a plurality of plasma generation apparatuses 100 between the top plate 1702 and the bottom plate 1704. In some embodiments, the housing 1701 includes any suitable durable, rigid, heat-resistant, inert material configured to withstand high temperatures and corrosive environments, such as alumina, silicon nitride, quartz, high-grade ceramic, metal alloy, composites thereof, and/or any other metal or material having suitable thermal and mechanical properties. In some embodiments, the gas neutralization assembly 1700 is configured to be disposed in a substantially enclosed environment such as a gas flue, smoke stack, or other suitable noxious gas environment to break down noxious gases or materials as they pass through the plasma field. In some embodiments, the gas neutralization assembly 1700 is configured to be disposed within the substantially enclosed environment such that the housing 1701 extends substantially transversely relative to one or more walls (not shown) defining the substantially enclosed environment.

Each of the plurality of plasma generation apparatuses 100 may be substantially similar to the plasma generation apparatus 100 described above with reference to FIG. 1. In some embodiments, each plasma generation apparatus 100 includes a housing element 102, a plasma reaction chamber 120, a plurality of electrode rings 126*a*-126*e*, and a power supply 140, as described in relation to the plasma generation apparatus 100 of FIG. 1.

In some embodiments, each of the plurality of plasma generation apparatus 100 is disposed within the housing element 102 such that the plasma generation apparatus 100 extends transversely between the top plate 1702 and the bottom plate 1704. In some embodiments, the top plate 1702 corresponds to the first end 110 of each plasma generation apparatus 100 and the bottom plate 1704 corresponds to the second end 112 of each plasma generation apparatus 100. In this manner, the gas neutralization assembly 1700 may process gases through each of the plasma generation apparatuses 100 in a direction from the top plate 1702 to the bottom plate 1704.

In one embodiment, the housing element 102 is configured to receive and retain nineteen (19) plasma generation apparatuses 100 in a substantially circular arrangement. Of course, the housing 1701 may be configured to receive and retain any number of plasma generation apparatuses 100 in any desired or suitable arrangement.

In some embodiments, the top plate 1702 and the bottom plate 1704 are substantially identical in shape and/or dimensions. In other embodiments, the top plate 1702 and/or the bottom plate 1704 includes a unique shape and/or dimensions. The shape and size of the top plate 1702 and the bottom plate 1704 may be selected such that the housing element 102 is configured to retain a desired number and arrangement of plasma generation apparatuses 100. In some embodiments, the shape and size of the top plate 1702 and the bottom plate 1704 are selected to enable the gas neutralization assembly 1700 to fit within the confines of a substantially enclosed noxious gas environment, such as a noxious gas flue, smoke stack, exhaust pipe, or the like.

In one embodiment, the housing 1701 includes a substantially circular top plate 1702 and bottom plate 1704 having substantially similar or identical diameters. The top plate 1702 may be disposed above the bottom plate 1704 such that an outer top edge 1714 of the top plate 1702 aligns with the outer bottom edge 1716 when the gas neutralization assembly 1700 is assembled. In some embodiments, the outer top edge 1714 and/or the outer bottom edge 1716 includes one or more features to facilitate securing the gas neutralization assembly 1700 within an enclosed area such as a pipe, flue, or smoke stack. For example, the outer top edge 1714 and/or the outer bottom edge 1716 may include one or more ridges, grooves, flanges, and/or other features configured to engage corresponding features of the enclosed area to secure a position of the gas neutralization assembly 1700 relative to the enclosed area. In these and other embodiments, one or more mechanical securing devices such as screws, rivets, bolts, grommets, adhesives, and/or the like may be coupled to the top plate 1702, the bottom plate 1704, the outer top edge 1714 and/or the outer bottom edge 1716 to secure the gas neutralization assembly 1700 to the enclosed area.

A distance 1705 between the top plate 1702 and the bottom plate 1704 may be substantially equal to a height 1722 of each of the plasma generation apparatuses 100. In some embodiments, the top plate 1702 includes a plurality of openings 1706 where each opening 1706 includes dimensions substantially corresponding to or less than the first end 110 of each plasma generation apparatus 100. Similarly, in certain embodiments, the bottom plate 1704 includes a plurality of openings 1708 where each opening 1708 includes dimensions substantially corresponding to or less than the second end 112 of each plasma generation apparatus 100. In this manner, corresponding openings 1706, 1708 may be configured to receive and retain each plasma generation apparatus 100 within the housing 1701. In some embodiments, the first end 110 and/or the second end 112 of each plasma generation apparatus 100 is exposed through the corresponding opening 1706, 1708.

In certain embodiments, at least a portion of the top plate 1702 extends over the first end 110 of each plasma generation apparatus 100 and at least a portion of the bottom plate 1704 extends over the second end 112 of each plasma generation apparatus 100. In this manner, one or more securing elements 1710 may extend through the top plate 1702 and/or the bottom plate 1704 to couple each plasma generation apparatus 100 to the housing 1701 such that the plasma generation apparatus 100 aligns with its corresponding opening 1706, 1708.

In certain embodiments, at least one securing element 1710 extends between the top plate 1702 and the first end 110 of the plasma generation apparatus 100. Similarly, in some embodiments, at least one securing element 1710 extends between the bottom plate 1704 and the second end 112 of the plasma generation apparatus 100. The securing elements 1710 may include, for example, nails, screws, rivets, bolts, grommets, adhesives, and/or the like.

Figure 19:
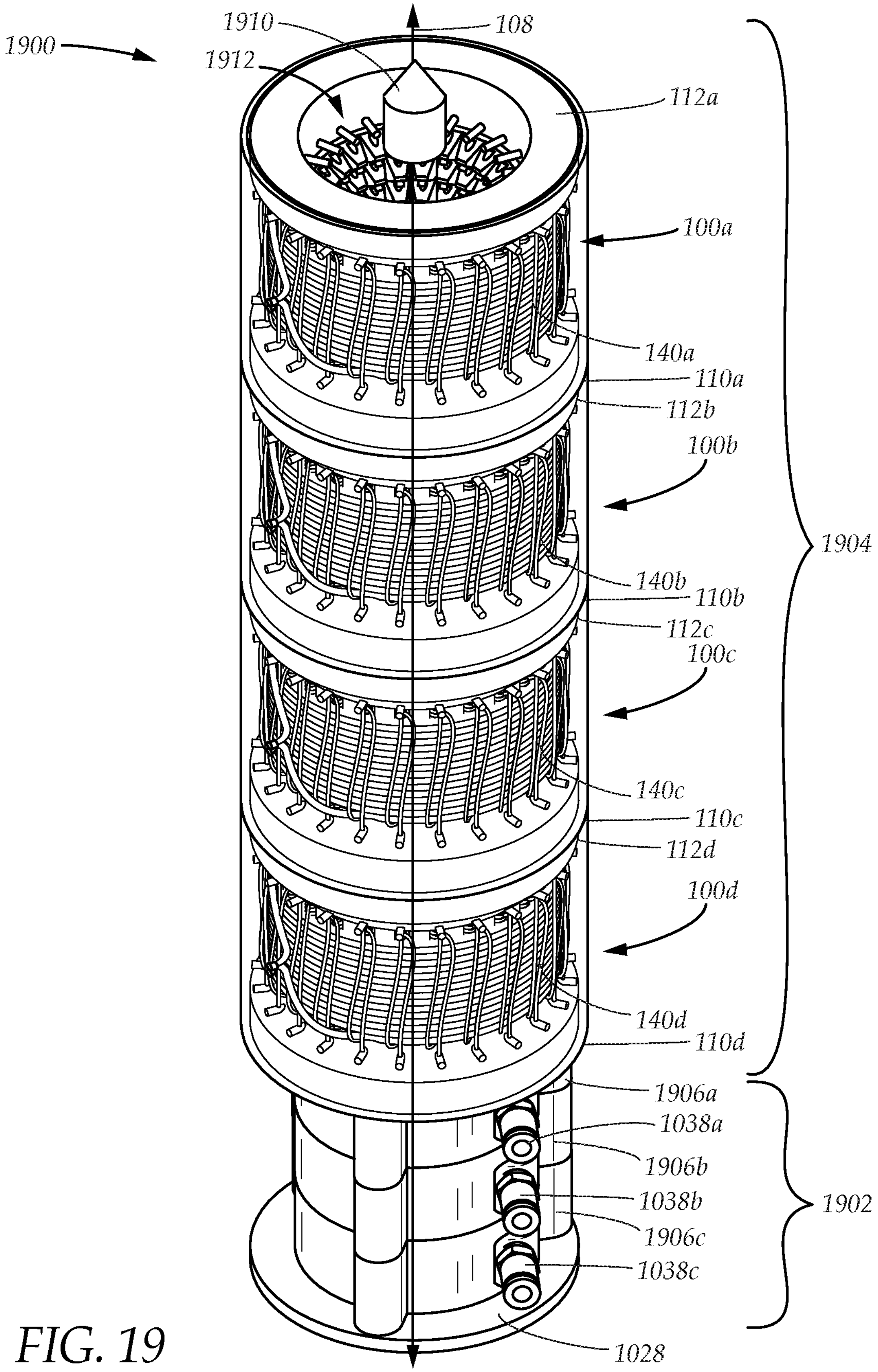
FIG. 19 is a perspective view of a vortex-assisted projectile apparatus including multiple plasma generation apparatuses forming a plasma chamber and multiple vortex generation elements forming a vortex chamber in accordance with various embodiments of the present disclosure.
Figure 20:
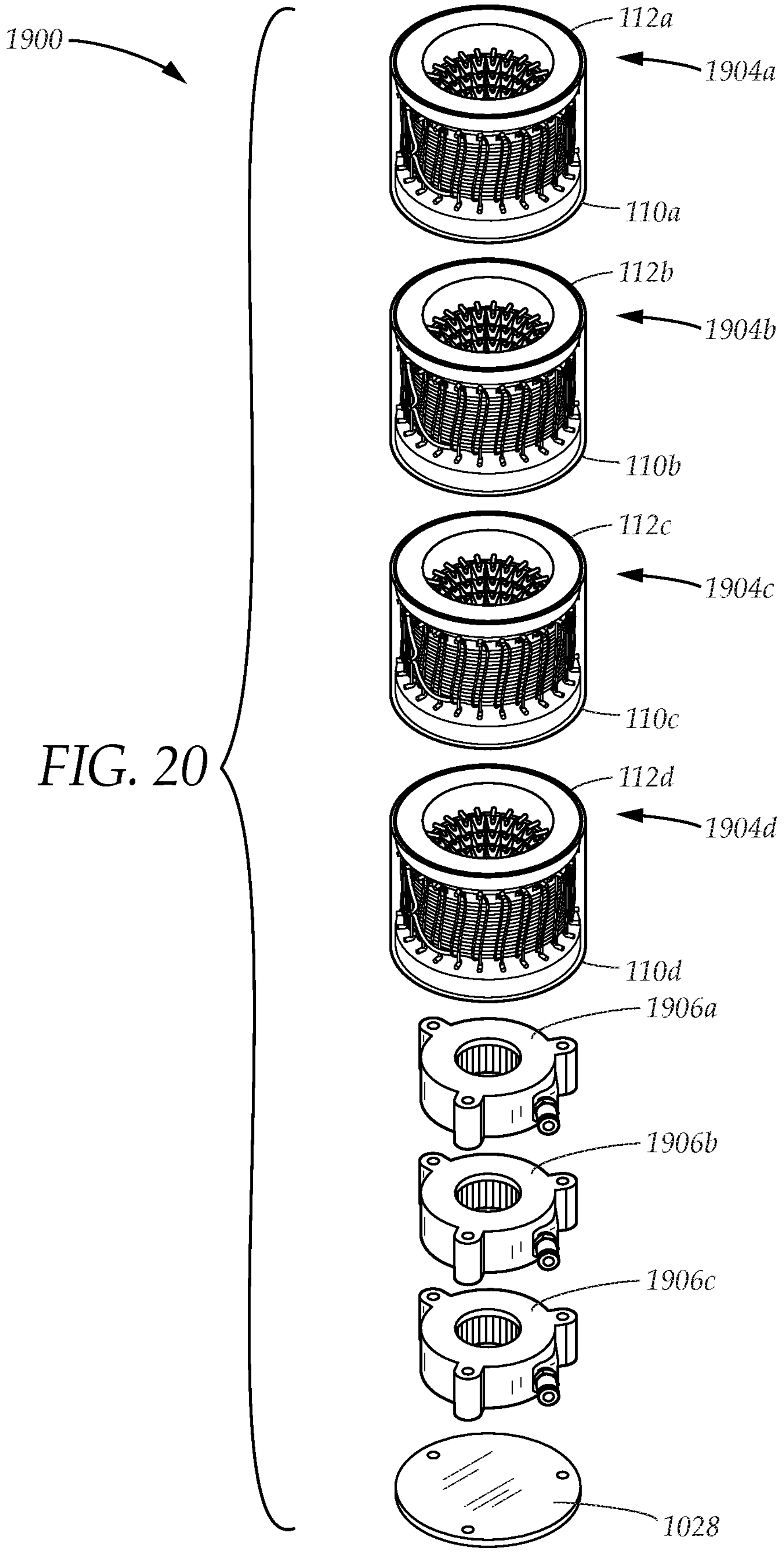
FIG. 20 is an exploded perspective view of the vortex-assisted projectile apparatus of FIG. 19.

Referring now to FIGS. 19 and 20, while also referring to FIG. 10, according to another aspect of the disclosure, in some embodiments, a vortex-assisted projectile apparatus 1900 is presented to provide precise projectile control and acceleration through the utilization of vortex dynamics and electromechanical mechanisms, such as electromagnetic propulsion.

In some embodiments, the vortex-assisted projectile apparatus 1900 includes more than one plasma generation apparatus 100*a*-100*d* coupled together in series along the longitudinal axis 108. For example, a first end 110*a* of one plasma generation apparatus 100*a* may be coupled to a second end 112*b* of a second plasma generation apparatus 100*b*. Similarly, a first end 110*b* of the second plasma generation apparatus 100*b* may be coupled to a second end 112*c* of a third plasma generation apparatus 100*c*, and a first end 110*c* of the third plasma generation apparatus 100*c* may be coupled to a second end 112*d* of a fourth plasma generation apparatus 100*d*, and so forth. More than one plasma generation apparatus 100*a*-100*d* may be coupled together in series via one or more suitable mechanical fastening devices or mechanisms, including for example, screws, bolts, rivets, grommets, welding, adhesives, and/or the like. In some embodiments, multiple plasma generation apparatuses 100*a*-100*d* coupled together in this manner form a plasma chamber 1904 configured to energize a charged projectile 1910.

In some embodiments, the plasma chamber 1904 is coupled to a vortex chamber 1902 including one or more vortex generation elements 1906*a*-1906*c* coupled together in series via any suitable mechanical device or mechanism. The vortex generation element 1906*a*-1906*c* may include a variable direction vortex generator element 1006 and/or a fixed direction vortex generator element 1004. Each vortex generation element 1906*a*-1906*c* may include at least one material port 1038*a*-1038*c* configured to receive a suitable material. The vortex generation element 1906 may be configured to utilize the material to generate one or more material vortexes within the vortex chamber 1902.

In some embodiments, the vortex chamber 1902 includes any combination of variable direction vortex generator elements 1006 and/or fixed direction vortex generator elements 1004. In some embodiments, adjacent vortex generation elements 1906*a*-1906*c* are separated by one or more orifice plate elements 1026 or other modular processing components 1024. In some embodiments, the plasma chamber 1904 and the vortex chamber 1902 are aligned along the longitudinal axis 108.

In some embodiments, the vortex chamber 1902 forms the initial stage of the vortex-assisted projectile apparatus 1900 and is configured to hold the charged projectile 1910 in a substantially stationary position via magnetic levitation. In some embodiments, the vortex chamber 1902 is configured to center the charged projectile 1910 and/or induce rotational motion. Such rotational motion may stabilize the charged projectile 1910 and prepare it for controlled acceleration.

The plasma chamber 1904 may be configured to generate an electromagnetic field 1912 to provide axial control and acceleration to the charged projectile (not shown). In operation, the plasma chamber 1904 may induce an electromagnetic field 1912 via the power supply 140 and arc paths 134*a*-134*i*. In some embodiments, the electromagnetic field 1912 provides back pressure on the charged projectile 1910, allowing for precise axial control and acceleration. In certain embodiments the intensity and/or direction of the electromagnetic field 1912 may be modulated to enable the vortex-assisted projectile apparatus 1900 to make fine-tuned adjustments to the charged projectile's 1910 trajectory and/or velocity.

In some embodiments, the moment forces induced by one or more vortexes generated in the vortex chamber 1902 cause the charged projectile 1910 to spin, further enhancing stability and accuracy during flight. When the desired rotational speed is achieved, the plasma chamber 1904 may temporarily de-energize, thereby allowing the charged projectile 1910 to transition smoothly into an acceleration phase.

In some embodiments, the vortex-assisted projectile apparatus 1900 incorporates multiple plasma chambers 1904 and/or timing circuits to further accelerate the charged projectile 1910 in stages. This modularity enables scalability and customization according to specific requirements and performance objectives. In some embodiments, the combination of the vortex chamber 1902 and the plasma chamber 1904 allows for enhanced projectile maneuverability and kinetic energy transfer, thereby enabling versatile applications in target alteration and various other fields.

In some embodiments, the plasma generation apparatus 100 is configured to generate hydrogen by a phenomenon that creates an additional hydrogen atom by colliding two photons into each other while in a field of hydrogen. For example, in some embodiments, the plasma reaction chamber 120 houses a field including hydrogen. The plasma generation apparatus 100 may accelerate photons in the plasma reaction chamber 120 during the arc to cause the photons to collide. In some embodiments, the intensity of the photons can be controlled by the amount of energy induced on the secondary coil 150 of the power supply 140, the intensity of a material vortex created by a vortex generator element 1004, 1006, and/or the chemical composition of catalyst material 136 inputs.

In some embodiments, the plasma generation apparatus 100 is configured to heat one or more materials. In other embodiments, the plasma generation apparatus 100 is configured to eliminate unwanted molecular compounds from one or more materials and/or manufactures desired molecular compounds. In some embodiments, the plasma generation apparatus 100 is configured to eliminate "forever chemicals" and/or bioburdens in potable or wastewater, for example. In some embodiments, the plasma generation apparatus 100 is configured to sinter concrete or another suitable material or combination of materials for application to a substrate or as a stand-alone process.

In one embodiment, the plasma generation system 1000 is implemented as an end effector of a cartesional robot, industrial robotic arm, and/or gantry system. The plasma generation system 1000 may be configured to deposit or "print" material onto a target or substrate. In another embodiment, two opposing plasma generation systems 1000 may be used in connection with a position manipulation system to create a wall of solidified material at the intersecting point of both spray patterns.

In some embodiments, the plasma generation apparatus 100 is configured to generate steam. As water and hydrogen or other combustables pass through the plasma generator, the combustables ignite, superheating the water. This may be an alternate energy source to coal, supplying the steam-powered electricity generator with steam.

In some embodiments, the plasma generation apparatus 100 is configured to be used as a catalytic converter replacement for internal combustion engines by placing the plasma generation apparatus 100 in the exhaust line of an internal combustion engine, thereby eliminating unwanted molecular compounds.

In some embodiments, the plasma generation apparatus 100 is configured to be used as an energy conversion and harvesting device, capturing released energy from the plasma reaction chamber 120 and/or chemical reaction using electromechanical crystals placed in the electrode rings 126*a*-126*e* of the plasma generation apparatus 100.

It is understood that when an element is referred hereinabove as being "on" another element, it can be directly on the other element or intervening elements may be present therebetween. In contrast, when an element is referred to as being "directly on" another element, there are no intervening elements present. Moreover, any components or materials can be formed from a same, structurally continuous piece or separately fabricated and connected.

It is further understood that, although ordinal terms, such as, "first," "second," "third," are used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Spatially relative terms, such as "beneath," "below," "lower," "above," "upper" and the like, are used herein for ease of description to describe one element or feature's relationship to another element(s) or feature(s) as illustrated in the figures. It is understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device can be otherwise oriented (rotated 90 degrees or at other orientations) and the spatially relative descriptors used herein interpreted accordingly. The term "substantially" is defined as at least 95% of the term being described and/or within a tolerance level known in the art and/or within 5% thereof.

The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

In conclusion, the disclosure is illustrated by example in the drawing figures, and throughout the written description. It should be understood that numerous variations are possible, while adhering to the inventive concept. Such variations are contemplated as being a part of the present disclosure.

What is claimed is:

1. A plasma generation apparatus for processing a material, comprising:

- a housing element comprising an inner surface extending cylindrically along a longitudinal axis between a first end and a second end, and an outer surface disposed opposite the inner surface between the first end and the second end;
- a plasma reaction chamber defined by the inner surface, the plasma reaction chamber configured to generate a plasma field for processing a material;
- a plurality of electrode rings disposed within the plasma reaction chamber, wherein each of the plurality of electrode rings comprises a plurality of electrodes, wherein at least a portion of the plurality of electrodes corresponding to more than one of the plurality of electrode rings forms an arc path between the first end and the second end; and
- a power supply coupled to the outer surface, the power supply comprising:
  - a plurality of primary coils winding about the outer surface in a direction perpendicular to the longitudinal axis;
  - a secondary coil winding about the plurality of primary coils in a direction perpendicular to the longitudinal axis, wherein the secondary coil is configured to induce a voltage on the plurality of primary coils; and
  - a coil core in contact with at least a portion of each of the plurality of primary coils.

2. The plasma generation apparatus of claim 1, wherein each of the first end and the second end comprises an exterior surface having a diameter greater than the outer surface such that the power supply is maintained between the first end and the second end.

3. The plasma generation apparatus of claim 1, wherein each of the plurality of primary coils comprises an anode and a cathode, wherein at least a portion of each of the anode and the cathode extends between the outer surface and the inner surface.

4. The plasma generation apparatus of claim 1, wherein the each of the plurality of electrode rings comprises a modular ring profile geometry.

5. The plasma generation apparatus of claim 1, wherein each of the plurality of electrode rings comprises an outer surface having a diameter corresponding to an inner diameter of the plasma reaction chamber.

6. The plasma generation apparatus of claim 1, wherein the plurality of electrode rings comprises a first electrode ring having a first set of catalysts and a second electrode ring having a second set of catalysts, wherein the first electrode ring is configured to be disposed adjacent to the second electrode ring to facilitate a chemical reaction between the first set of catalysts and the second set of catalysts.

7. The plasma generation apparatus of claim 1, wherein each of the plurality of electrode rings comprises a plurality of piezoelectric crystals configured to harvest arc energy.

8. A plasma generation system for processing a material through a plasma field, comprising:

a plasma generation apparatus, comprising:

a housing element comprising an inner surface extending cylindrically along a longitudinal axis between a first end and a second end, and an outer surface disposed opposite the inner surface between the first end and the second end;

a plasma reaction chamber defined by the inner surface, the plasma reaction chamber configured to generate a plasma field for processing a material;

a plurality of electrode rings disposed within the plasma reaction chamber, wherein each of the plurality of electrode rings comprises a plurality of electrodes, wherein at least a portion of the plurality of electrodes corresponding to more than one of the plurality of electrode rings forms an arc path between the first end and the second end; and a power supply coupled to the outer surface, the power supply comprising:

a plurality of primary coils winding about the outer surface in a direction perpendicular to the longitudinal axis;

a secondary coil winding about the plurality of primary coils in a direction perpendicular to the longitudinal axis, wherein the secondary coil is configured to induce a voltage on the plurality of primary coils; and a coil core in contact with at least a portion of each of the plurality of primary coils; and a plurality of modular processing components coupled to the plasma generation apparatus and configured to form a hollow processing chamber aligned with the longitudinal axis, the plurality of modular processing components comprising at least one of:

a vortex generator element comprising an exterior surface, an interior surface, and an interior vortex formation element, wherein a material inlet is disposed in the exterior surface and configured to communicate a material to the interior vortex formation element via a material channel, wherein the interior vortex formation element processes the material to generate a material vortex within the hollow processing chamber;

an orifice plate element having an orifice configured to shape the material vortex within the hollow processing chamber; and a raw material injection collar comprising an exterior edge and a hollow inner surface, wherein the exterior edge comprises a material port configured to direct a material into the hollow processing chamber.

9. The plasma generation system of claim 8, wherein the plurality of modular processing components further comprises a mounting plate coupled to an end of the hollow processing chamber, wherein the mounting plate is configured to mount the plasma generation system to a robotic arm.

10. The plasma generation system of claim 8, wherein the interior vortex formation element comprises one of a fixed direction vortex formation element and a variable direction vortex formation element.

11. The plasma generation system of claim 10, wherein the variable direction vortex formation element comprises a tubing element comprising a plurality of exit pathways communicating with the hollow processing chamber, wherein each of the plurality of exit pathways extends away from the tubing element at an angle.

12. The plasma generation system of claim 10, wherein the fixed direction vortex formation element comprises a plurality of plates defining a whorl formation within the vortex generator element, wherein each of the plurality of plates is spaced apart from an adjacent plate of the plurality of plates by a channel in fluid communication with the hollow processing chamber.

13. The plasma generation system of claim 12, wherein each of the plurality of plates comprises a fluted edge disposed along the interior surface, wherein the fluted edge extends in a direction parallel to the longitudinal axis.

14. The plasma generation system of claim 8, wherein the vortex generator element comprises a first vortex generator element oriented in a first orientation and configured to generate a first material vortex, and a second vortex generator element oriented in a second orientation and configured to generate a second material vortex, wherein the first material vortex and the second material vortex are disposed in opposite directions to form a volatile interface layer configured to refine aggregate material into smaller pieces.

15. A method for processing a material, the method comprising:

providing a plasma generation apparatus configured to process a material through a plasma field, the plasma generation apparatus comprising:

a housing element comprising an outer surface and an inner surface extending cylindrically along a longitudinal axis between a first end and a second end, wherein the outer surface is disposed opposite the inner surface;

a plasma reaction chamber having an inner circumference defined by the inner surface, the plasma reaction chamber configured to generate the plasma field;

a plurality of electrode rings disposed within the plasma reaction chamber, wherein each of the plurality of electrode rings comprises a plurality of electrodes, wherein at least a portion of the plurality of electrodes corresponding to more than one of the plurality of electrode rings forms an arc path between the first end and the second end; and a power supply coupled to the outer surface, the power supply comprising:

a plurality of primary coils winding about the outer surface in a direction perpendicular to the longitudinal axis;

a secondary coil winding about the plurality of primary coils in a direction perpendicular to the longitudinal axis, wherein the secondary coil is configured to induce a voltage on the plurality of primary coils; and a coil core in contact with at least a portion of each of the plurality of primary coils;

actuating the power supply to energize the secondary coil such that arc energy is transmitted along the arc path, wherein the arc energy generates the plasma field within the plasma reaction chamber; and conveying, through the plasma field, the material for processing.

16. The method of claim 15, wherein the power supply comprises an anode disposed at one end of the plasma reaction chamber and a cathode disposed near an opposite end of the plasma reaction chamber, wherein transmitting the arc energy comprises transmitting the arc energy between the anode and the cathode.

17. The method of claim 16, wherein transmitting the arc energy further comprises directing an excess of the arc energy to exit the plasma reaction chamber via one of the first end and the second end.

18. The method of claim 15, wherein each of the plurality of electrode rings comprises a plurality of piezoelectric crystals configured to harvest the arc energy from the arc path.

19. The method of claim 15, further comprising disposing within the plasma reaction chamber a first electrode ring having a first set of catalysts and a second electrode ring having a second set of catalysts, wherein the first electrode ring is disposed adjacent to the second electrode ring to facilitate a chemical reaction between the first set of catalysts and the second set of catalysts.

20. The method of claim 15, further comprising disposing, within a housing comprising a top plate and a bottom plate, a plurality of plasma generation apparatuses to form a material processing assembly, wherein the material processing assembly is configured to process noxious materials in an enclosed environment.

* * * * *